(12) United States Patent
Apelgren et al.

(10) Patent No.: US 6,610,594 B2
(45) Date of Patent: Aug. 26, 2003

(54) LOCALLY INCREASING SIDEWALL DENSITY BY ION IMPLANTATION

(75) Inventors: Eric M. Apelgren, Austin, TX (US); Christian Zistl, Austin, TX (US); Jeremy I. Martin, Austin, TX (US); Paul R. Besser, Austin, TX (US); Fred Cheung, Newark, CA (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/902,024

(22) Filed: Jul. 10, 2001

(65) Prior Publication Data

US 2003/0013296 A1 Jan. 16, 2003

(51) Int. Cl.⁷ .......................................... H01L 21/4763
(52) U.S. Cl. .................. 438/629; 438/637; 438/672; 438/675
(58) Field of Search ................. 438/624, 625, 438/629, 634, 637, 671, 945, 668, 672, 675

(56) References Cited

U.S. PATENT DOCUMENTS

| | | | | |
|---|---|---|---|---|
| 5,817,572 A | * | 10/1998 | Chiang et al. | 438/624 |
| 6,114,259 A | * | 9/2000 | Sukharev et al. | 438/789 |
| 6,221,780 B1 | | 4/2001 | Greco et al. | 438/702 |
| 6,225,204 B1 | * | 5/2001 | Wu et al. | 438/597 |
| 6,329,234 B1 | * | 12/2001 | Ma et al. | 438/210 |
| 6,355,555 B1 | * | 3/2002 | Park | 438/634 |
| 6,444,136 B1 | * | 9/2002 | Liu et al. | 216/62 |

FOREIGN PATENT DOCUMENTS

JP          2001267418 A     9/2001  ................. 21/768

OTHER PUBLICATIONS

International PCT Search Report dated Jun. 12, 2002.

* cited by examiner

Primary Examiner—Olik Chaudhuri
Assistant Examiner—Khiem Nguyen
(74) Attorney, Agent, or Firm—Williams, Morgan & Amerson

(57) ABSTRACT

A method is provided, the method comprising forming a first conductive structure, and forming a first dielectric layer above the first conductive structure. The method also comprises forming a first opening in the first dielectric layer above at least a portion of the first conductive structure, the first opening having sidewalls, and densifying the sidewalls.

45 Claims, 20 Drawing Sheets

LOCALLY INCREASING SIDEWALL DENSITY BY ION IMPLANTATION

BACKGROUND OF THE INVENTION

1. Field of the Invention

This invention relates generally to semiconductor fabrication technology, and, more particularly, to techniques for filling contact openings and vias with copper and creating copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+(P^+)$ source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry aluminum (Al) atoms along with the current, causing them to electromigrate, may lead to degradation of the aluminum (Al) interconnects, further increased resistance, and even disconnection and/or delamination of the aluminum (Al) interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because aluminum (Al) is inexpensive and easier to etch than, for example, copper (Cu). However, because aluminum (Al) has poor electromigration characteristics and high susceptibility to stress migration, it is typical to alloy aluminum (Al) with other metals.

As discussed above, as semiconductor device geometries shrink and clock speeds increase, it becomes increasingly desirable to reduce the resistance of the circuit metallization. The one criterion that is most seriously compromised by the use of aluminum (Al) for interconnects is that of conductivity. This is because the three metals with lower resistivities (Al has a resistivity of $2.824 \times 10^{-6}$ ohms-cm at $20°$ C.), namely, silver (Ag) with a resistivity of $1.59 \times 10^{-6}$ ohms-cm (at $20°$ C.), copper (Cu) with a resistivity of $1.73 \times 10^{-6}$ ohms-cm (at $20°$ C.), and gold (Au) with a resistivity of $2.44 \times 10^6$ ohms-cm (at $20°$ C.), fall short in other significant criteria. Silver, for example, is relatively expensive and corrodes easily, and gold is very costly and difficult to etch. Copper, with a resistivity nearly on par with silver, immunity from electromigration, high ductility (which provides high immunity to mechanical stresses generated by differential expansion rates of dissimilar materials in a semiconductor chip) and high melting point ($1083°$ C. for copper (Cu) vs. $659°$ C. for Al), fills most criteria admirably. However, copper (Cu) is difficult to etch in a semiconductor environment. As a result of the difficulty in etching Cu, an alternative approach to forming vias and metal lines must be used. The damascene approach (single and dual), consisting of etching openings such as trenches in the dielectric for lines and vias and creating in-laid metal patterns, is the leading contender for fabrication of sub-0.25 micron (sub-0.25 $\mu$) design rule copper-metallized circuits.

However, the lower resistance and higher conductivity of the copper (Cu) interconnects, coupled with higher device density and, hence, decreased distance between the copper (Cu) interconnects, may lead to increased capacitance between the copper (Cu) interconnects. Increased capacitance between the copper (Cu) interconnects, in turn, results in increased RC time delays and longer transient decay times in the semiconductor device circuitry, causing decreased overall operating speeds of the semiconductor devices.

One conventional solution to the problem of increased capacitance between the copper (Cu) interconnects is to use "low dielectric constant" or "low K" dielectric materials, where K is less than about 4, for the interlayer dielectric layers (ILDs) in which the copper (Cu) interconnects are formed using the damascene techniques. However, low K dielectric materials are difficult materials to use in conjunction with the damascene techniques. For example, low K dielectric materials are susceptible to being damaged and weakened during the etching and subsequent processing steps used in the damascene techniques. In particular, the sidewalls of openings such as trenches and/or vias formed in low K dielectric materials are especially vulnerable, due at least in part to the low density of low K dielectric materials.

The present invention is directed to overcoming, or at least reducing the effects of, one or more of the problems set forth above.

SUMMARY OF THE INVENTION

In one aspect of the present invention, a method is provided, the method comprising forming a first conductive structure, and forming a first dielectric layer above the first conductive structure. The method also comprises forming a first opening in the first dielectric layer above at least a portion of the first conductive structure, the first opening having sidewalls, and densifying the sidewalls.

In another aspect of the present invention, a device is provided, the device comprising a first conductive structure, and a first dielectric layer above the first conductive structure. The device also comprises a first opening in the first dielectric layer above at least a portion of the first conductive structure, the first opening having densified sidewalls.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
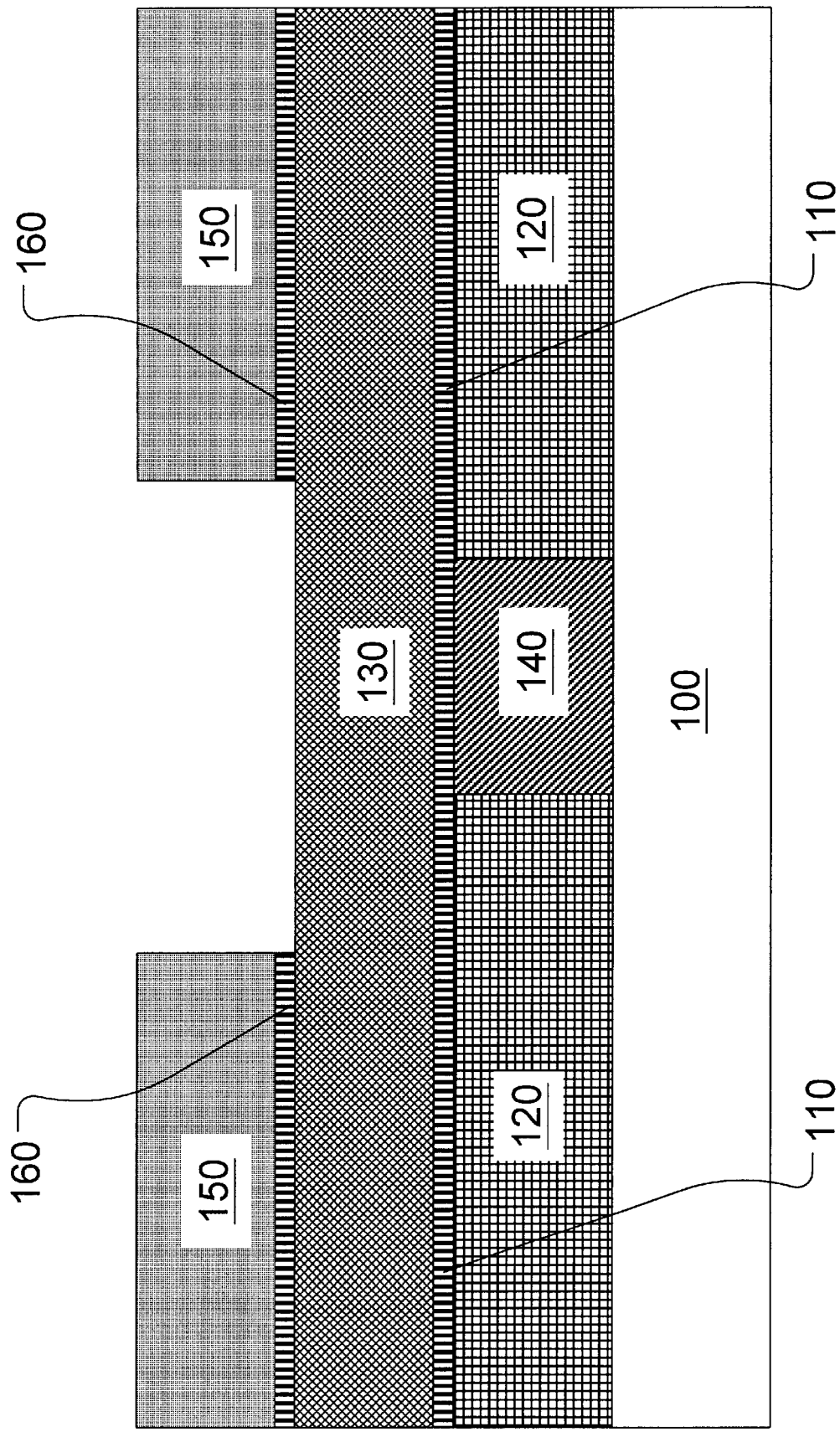
FIGS. 1–8 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–20. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first dielectric layer 120 and a first conductive structure 140 (such as a copper intermetal via connection) may be formed above a structure 100 such as a semiconducting substrate. However, the present invention is not limited to the formation of a copper-based interconnect above the surface of a semiconducting substrate such as a silicon wafer, for example. Rather, as will be apparent to one skilled in the art upon a complete reading of the present disclosure, a copper-based interconnect formed in accordance with the present invention may be formed above previously formed semiconductor devices and/or process layer, e.g., transistors, or other similar structure. In effect, the present invention may be used to form process layers on top of previously formed process layers. The structure 100 may be an underlayer of semiconducting material, such as a silicon substrate or wafer, or, alternatively, may be an underlayer of semiconductor devices (see FIG. 10, for example), such as a layer of metal oxide semiconductor field effect transistors (MOSFETs), and the like, and/or a metal interconnection layer or layers (see FIG. 9, for example) and/or an interlayer dielectric (ILD) layer or layers, and the like.

In a single-damascene copper process flow, according to various embodiments of the present invention, as shown in FIGS. 1–8, the first dielectric layer 120 is formed above the structure 100, adjacent the first conductive structure 140. An etch stop layer 110 (typically silicon nitride, $Si_3N_4$, or SiN, for short) is formed above the first dielectric layer 120 formed above the structure 100 and adjacent the first conductive structure 140. A second dielectric layer 130 is formed above the etch stop layer 110. A patterned photomask 150 is formed above the second dielectric layer 130. If necessary, the second dielectric layer 130 may have been planarized using a chemical-mechanical planarization (CMP) process. The second dielectric layer 130 has a hard mask layer 160 (typically also SiN) formed and patterned thereon, between the second dielectric layer 130 and the patterned photomask 150. The hard mask layer 160 may be patterned using the patterned photomask 150, for example.

The first and second dielectric layers 120 and 130 may be formed from a variety of "low dielectric constant" or "low K" (K is less than or equal to about 4) dielectric materials. The low K first and second dielectric layers 120 and 130 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and each may have a thickness ranging from approximately 1000 Å–5000 Å, for example.

The low K first and second dielectric layers 120 and 130 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the low K first and second dielectric layers 120 and 130 are each comprised of Applied Material's Black Diamond®, each having a thickness of approximately 5000 Å, each being formed by being blanket-deposited by a PECVD.

Figure 2:
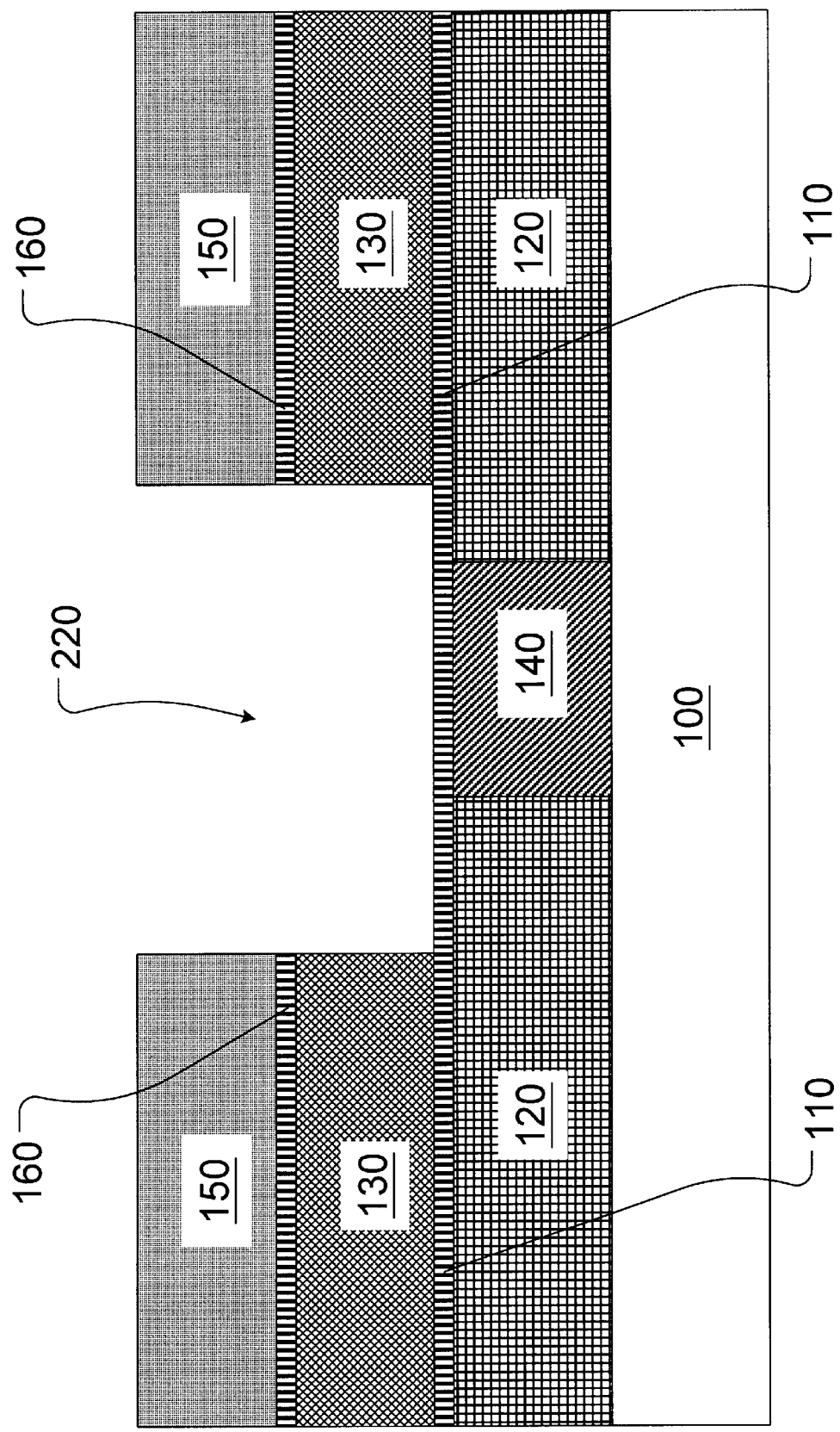

As shown in FIG. 2, a metallization pattern is then formed by using the patterned photomask 150, the etch stop layer 110 and the hard mask layer 160 (FIGS. 1–2), and photolithography. For example, openings (such as an opening or trench 220 formed above at least a portion of the first conductive structure 140) for conductive metal lines, contact holes, via holes, and the like, are etched into the second dielectric layer 130 (FIG. 2). The opening 220 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments. The etching may stop at the etch stop layer 110.

Figure 3:
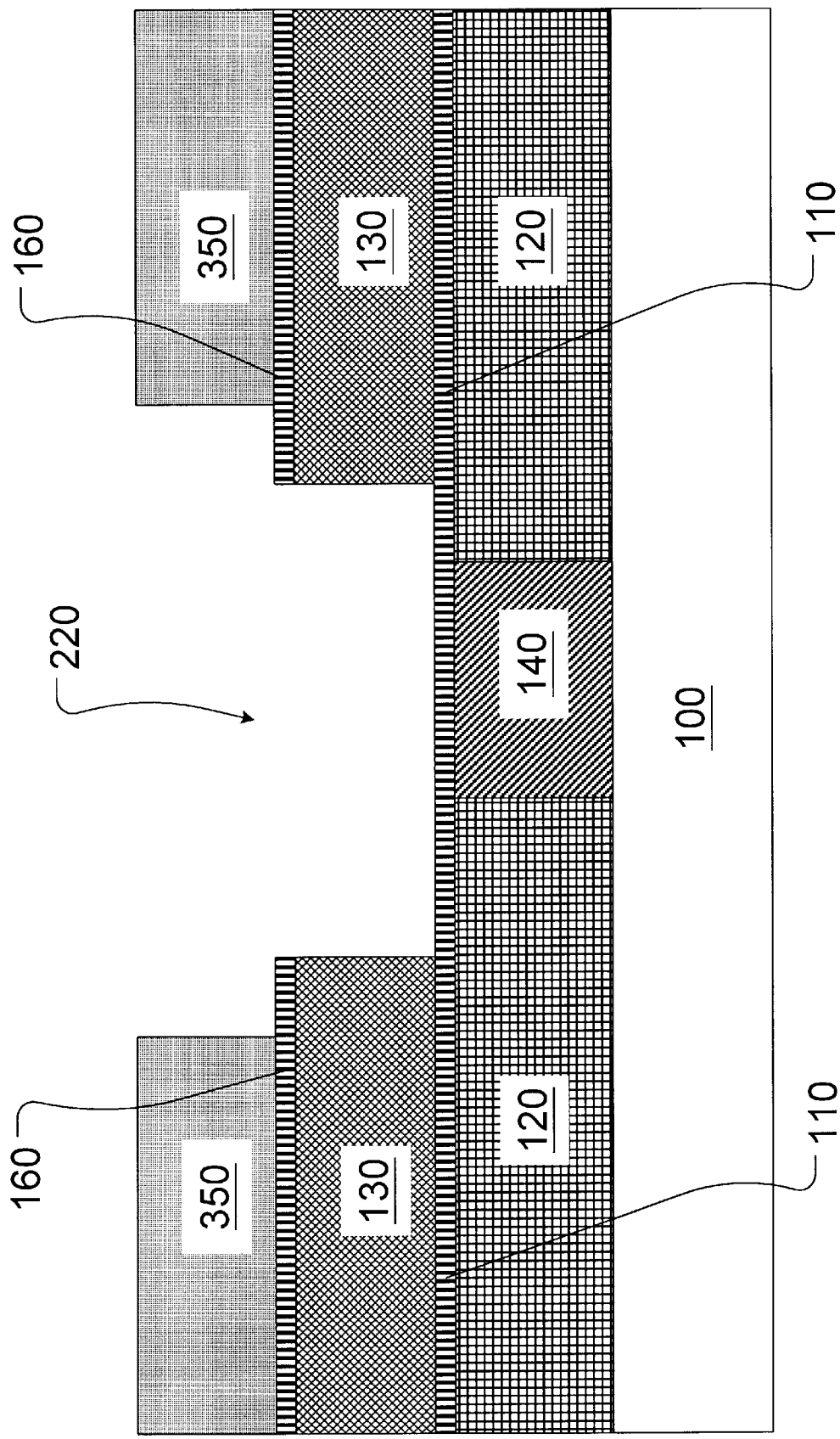

As shown in FIG. 3, the patterned photomask 150 is trimmed, using a controlled photoresist trim, for example, forming a trimmed photomask 350. The patterned photomask 150 may be trimmed by ashing, using a molecular oxygen ($O_2$) ashing, for example. Approximately 100–500 Å of the patterned photomask 150 may be trimmed by the ashing.

Figure 4:
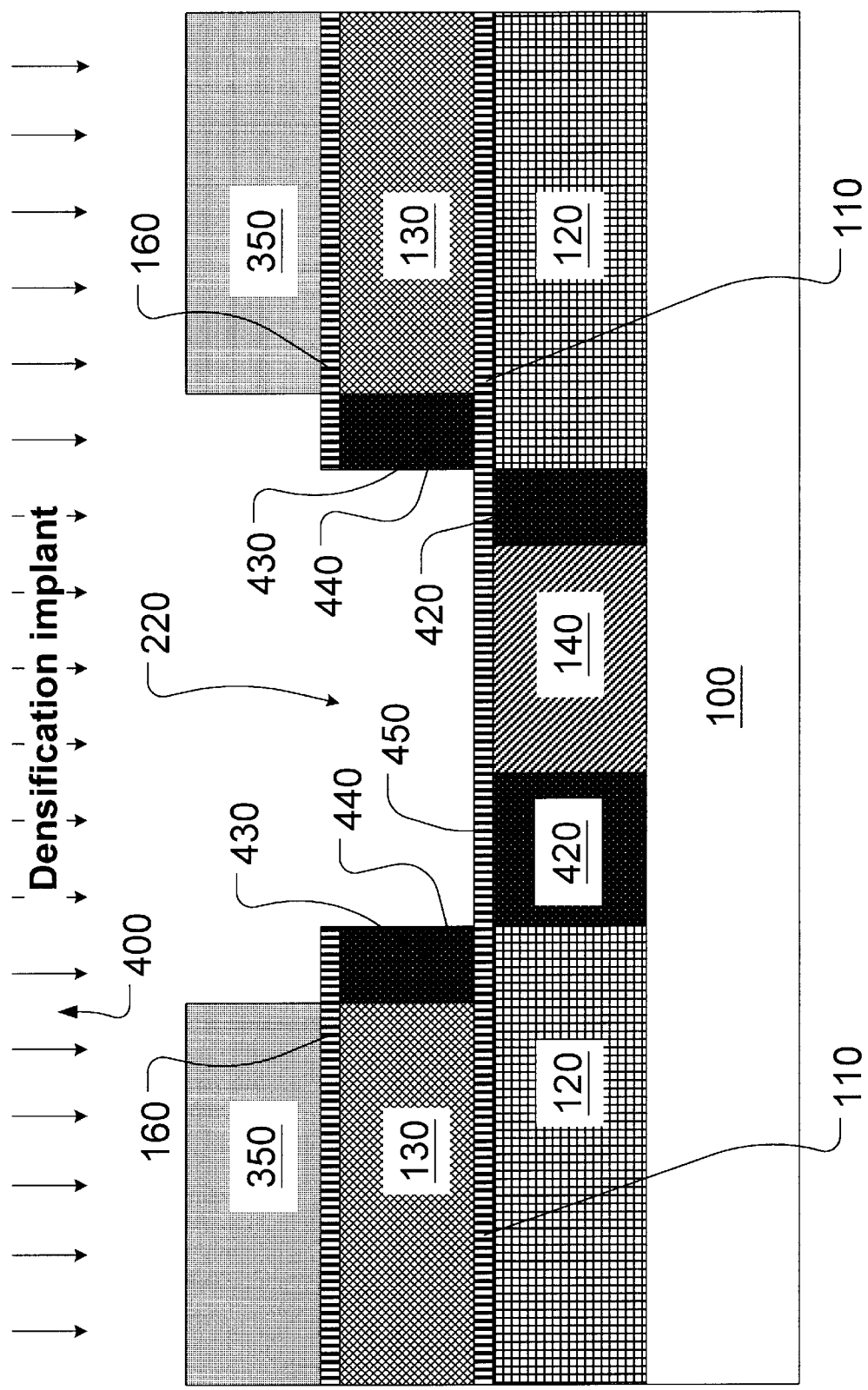

As shown in FIG. 4, a densification implant 400 (indicated by the arrows) may be implanted into the low K first and second dielectric layers 120 and 130 to form respective densified regions 420 and 430 in the low K first and second dielectric layers 120 and 130 adjacent the opening 220. The densified regions 420 in the low K first dielectric layer 120 would, of course, be symmetrical if the first conductive structure 140 were centered in the opening 220. The densification implant 400 increases the density of sidewalls 440 and bottom areas 450 of the opening 220 by about 5–50%, and, hence, reinforces the sidewalls 440 and the bottom areas 450 of the opening 220. In various illustrative embodiments, the densified regions 420 and 430 may be formed by being implanted with a densification dose of silicon (Si), silicon dioxide ($SiO_2$), germanium (Ge), and the like. The densification dose of the densification implant 400 may range from about $5.0 \times 10^{13}$–$2.0 \times 10^{15}$ ions/cm$^2$ at an implant energy ranging from about 5–50 keV. The densified regions 420 and 430 may be subjected to a rapid thermal anneal (RTA) process performed at a temperature ranging from approximately 400–1000° C. for a time ranging from approximately 5–60 seconds. The RTA process may activate the densification implant 400 and reinforce the densification process.

Figure 5:
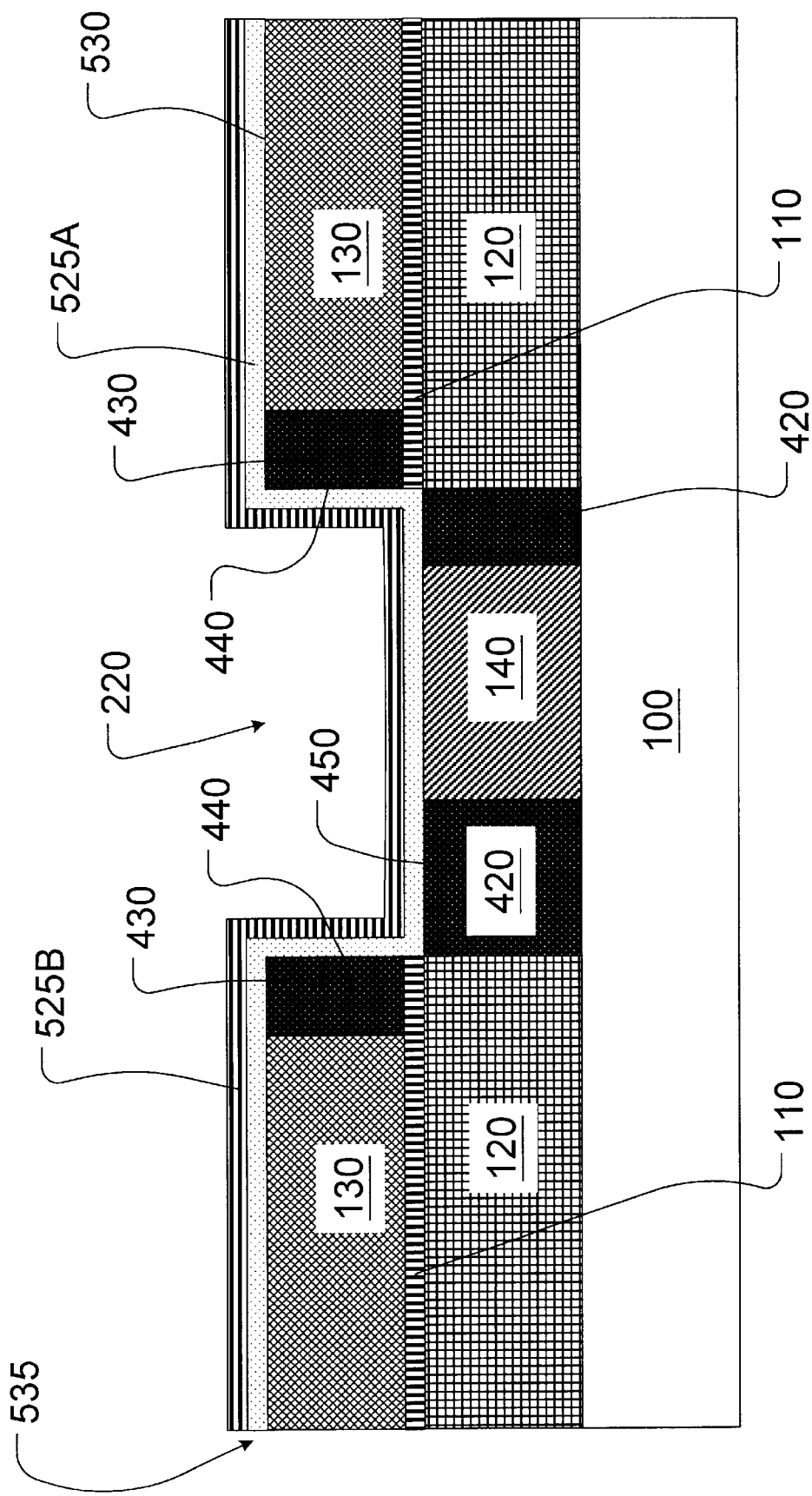

As shown in FIG. 5, the trimmed photomask 350 and the hard mask layer 160 are then stripped, the etch stop layer 110 is removed above the first conductive structure 140, and a thin barrier metal layer 525A and a copper seed layer 525B are applied to the entire surface using vapor-phase deposition (FIG. 5). The barrier metal layer 525A and the copper (Cu) seed layer 525B blanket-deposit an entire upper surface 530 of the second dielectric layer 130 as well as the sidewalls 440 and the bottom areas 450 of the opening 220, and first conductive structure 140, thereby forming a conductive surface 535, as shown in FIG. 5.

The barrier metal layer 525A may be formed of at least one layer of a barrier metal material, such as tantalum or tantalum nitride, and the like. For example, the barrier metal layer 525A may also be formed of titanium nitride, titanium-tungsten, nitrided titanium-tungsten, or another suitable barrier material. The copper seed layer 525B may be formed on top of the one or more barrier metal layers 525A by physical vapor deposition (PVD) or chemical vapor deposition (CVD), for example.

The bulk of the copper trench-fill is frequently done using an electroplating technique, where the conductive surface 535 is mechanically clamped to an electrode (not shown) to establish an electrical contact, and the structure 100 is then immersed in an electrolyte solution containing copper (Cu) ions. An electrical current is then passed through the wafer-electrolyte system to cause reduction and deposition of copper (Cu) on the conductive surface 535. In addition, an alternating-current bias of the wafer-electrolyte system has been considered as a method of self-planarizing the deposited copper (Cu) film, similar to the deposit-etch cycling used in high-density plasma (HDP) tetraethyl orthosilicate (TEOS) dielectric depositions.

Figure 6:
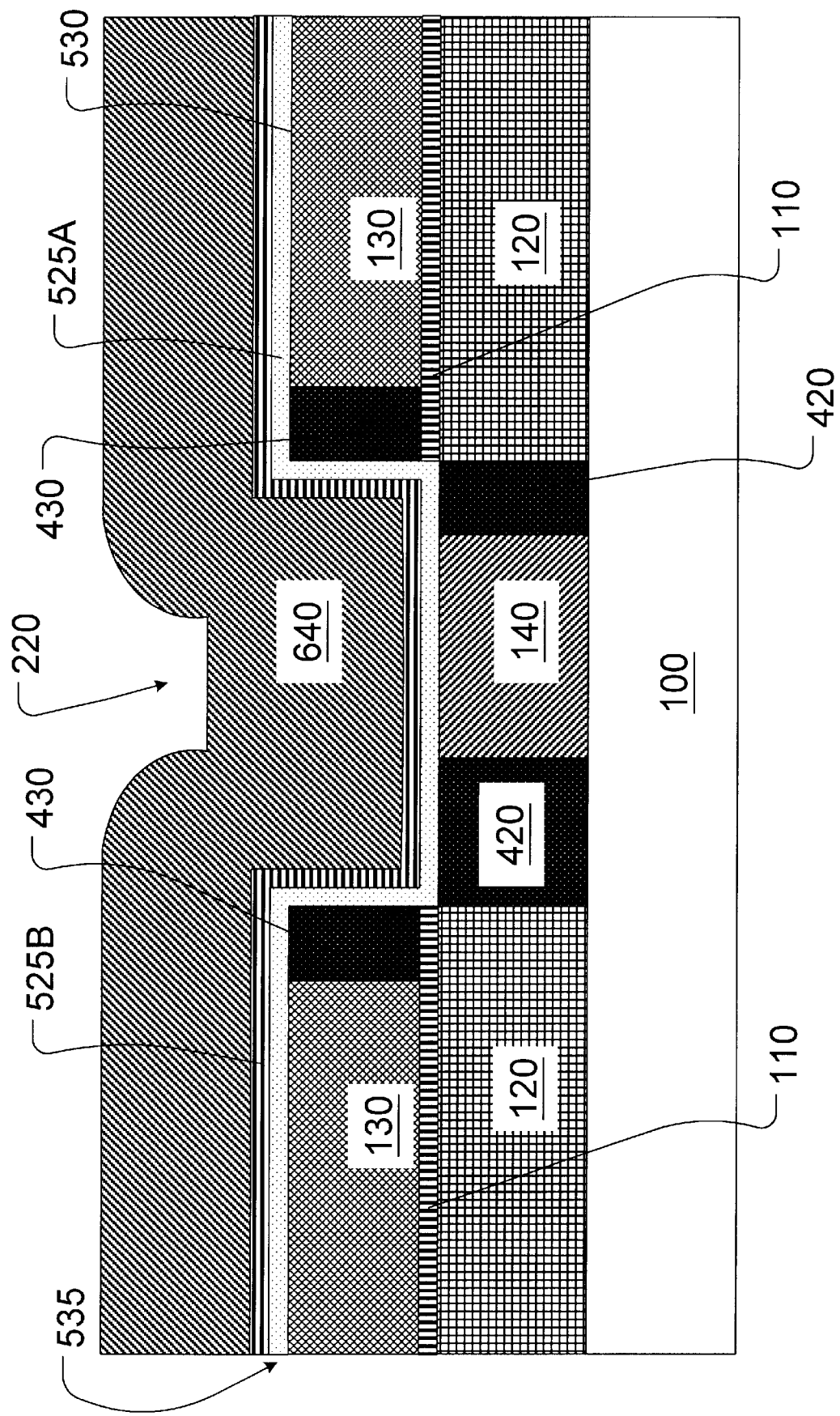
Figure 7:
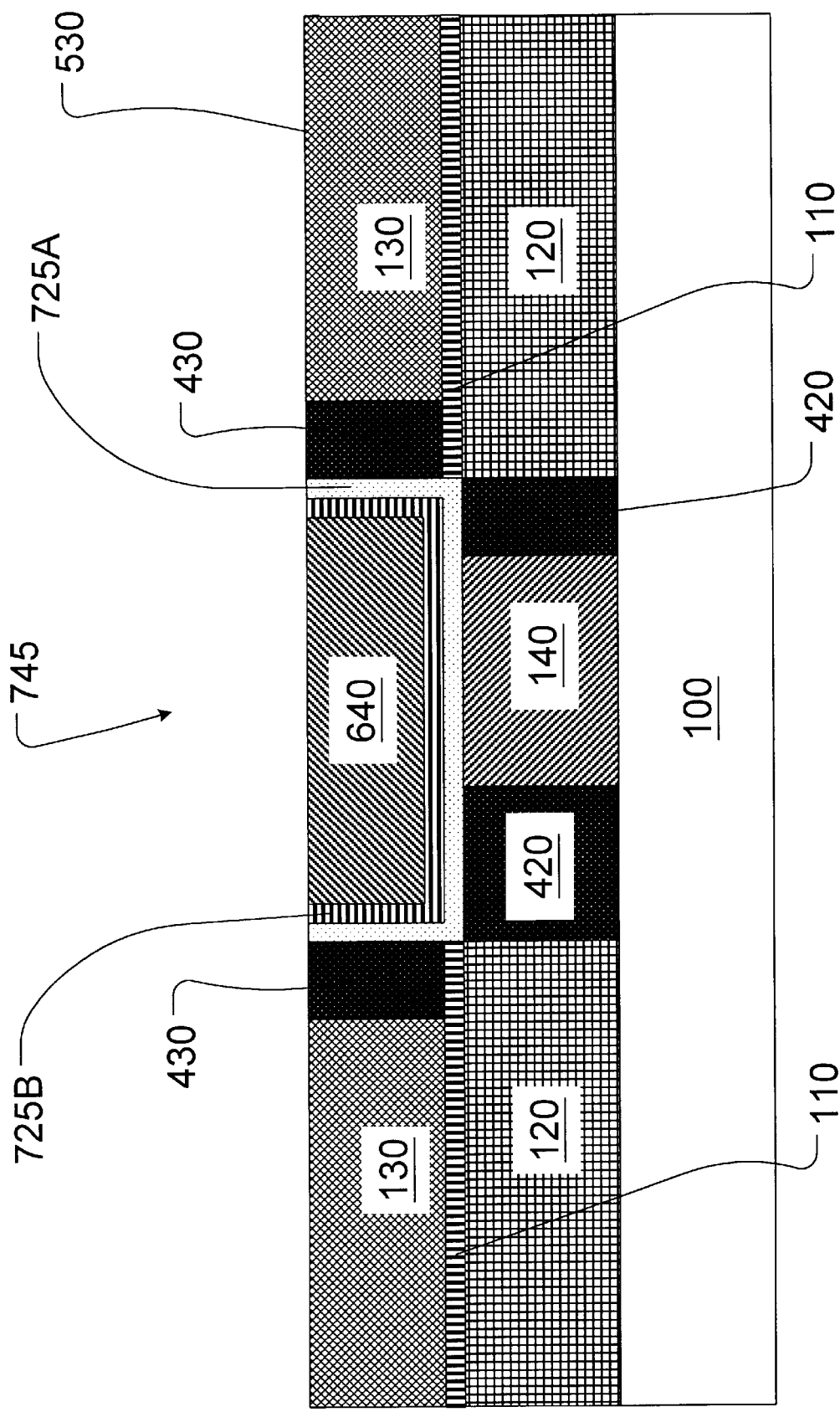

As shown in FIG. 6, this process typically produces a conformal coating of copper (Cu) 640 of substantially constant thickness across the entire conductive surface 535. As shown in FIG. 7, once a sufficiently thick layer of copper (Cu) 640 has been deposited, the layer of copper (Cu) 640 is planarized using chemical mechanical polishing (CMP) techniques. The planarization using CMP clears all copper (Cu) and barrier metal from the entire upper surface 530 of the second dielectric layer 130, leaving the copper (Cu) 640 only in a metal structure such as a copper-filled trench, forming a copper-interconnect 745, adjacent remaining portions 725A and 725B of the one or more barrier metal layers 525A and copper seed layer 525B (FIGS. 5 and 6), respectively, as shown in FIG. 7.

As shown in FIG. 7, the copper-interconnect 745 may be formed by annealing the copper (Cu) 640, adjacent the remaining portions 725A and 725B of the one or more barrier metal layers 525A and copper seed layer 525B (FIGS. 5 and 6), to the first conductive structure 140. The anneal process may be performed in a traditional tube furnace, at a temperature ranging from approximately 100–500° C., for a time period ranging from approximately 10–180 minutes, in a nitrogen-containing ambient that may comprise at least one of $N_2$, $H_2$, Ar, $NH_3$, and the like. Alternatively, the anneal process may be a rapid thermal anneal (RTA) process performed at a temperature ranging from approximately 100–500° C. for a time ranging from approximately 10–180 seconds in a nitrogen-containing ambient that may comprise at least one of $N_2$, $H_2$, Ar, and the like.

Figure 8:
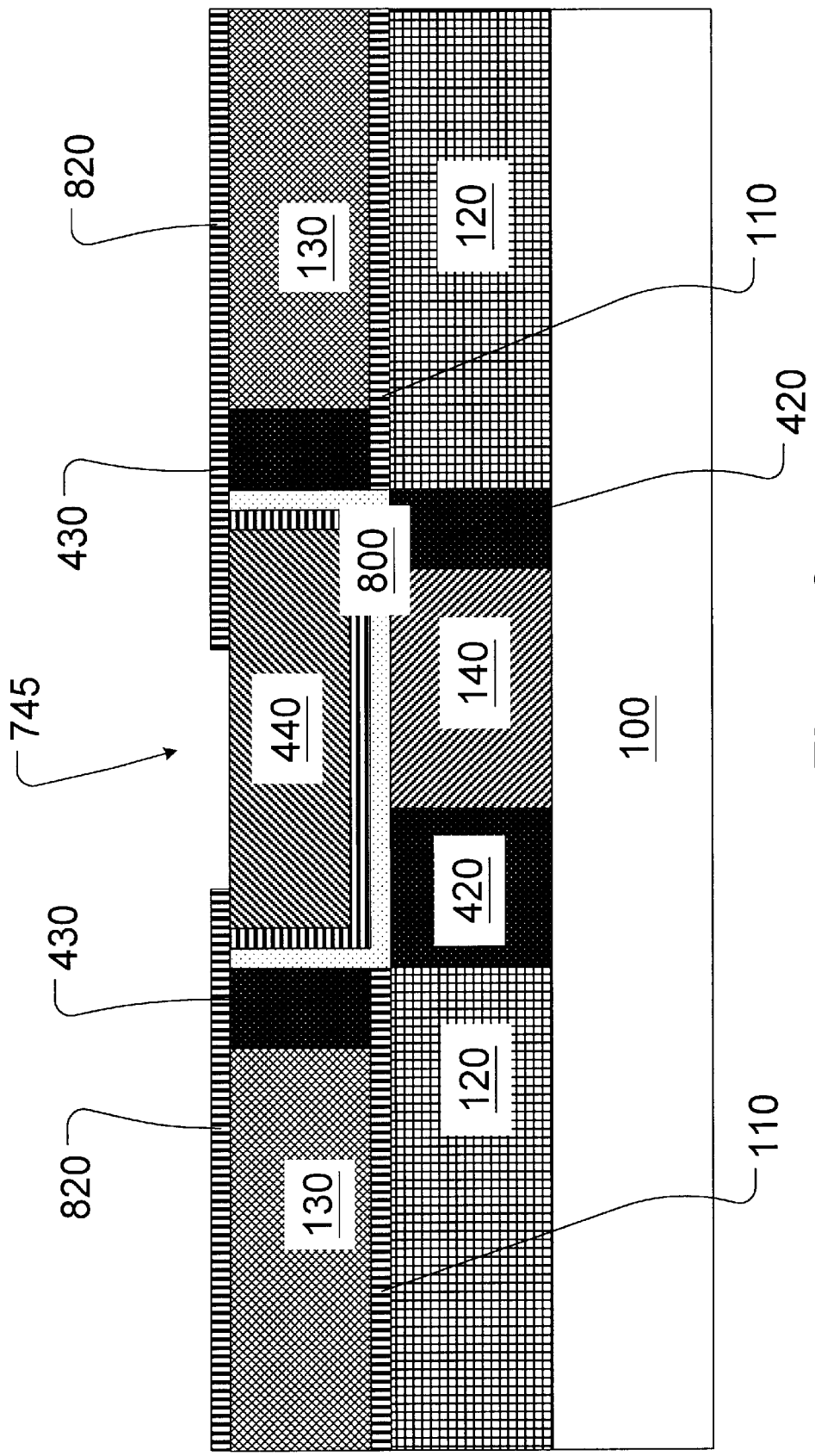

As shown in FIG. 8, the low K second dielectric layer 130 may be planarized, as needed, using chemical mechanical polishing (CMP) techniques. Planarization would leave the planarized low K second dielectric layer 130 adjacent the copper-interconnect 745 and above the etch stop layer 110, forming a copper-interconnect layer 800. The copper-interconnect layer 800 may comprise the copper-interconnect 745 adjacent the densified regions 430 of the second dielectric layer 130. The copper-interconnect layer 800 may also comprise the etch stop layer 110. As shown in FIG. 8, the copper-interconnect layer 800 may also comprise an etch stop layer 820 (also known as a "hard mask" and typically formed of silicon nitride, $Si_3N_4$, or SiN, for short) formed and patterned above the second dielectric layer 130 and above at least a portion of the copper-interconnect 745.

Figure 9:
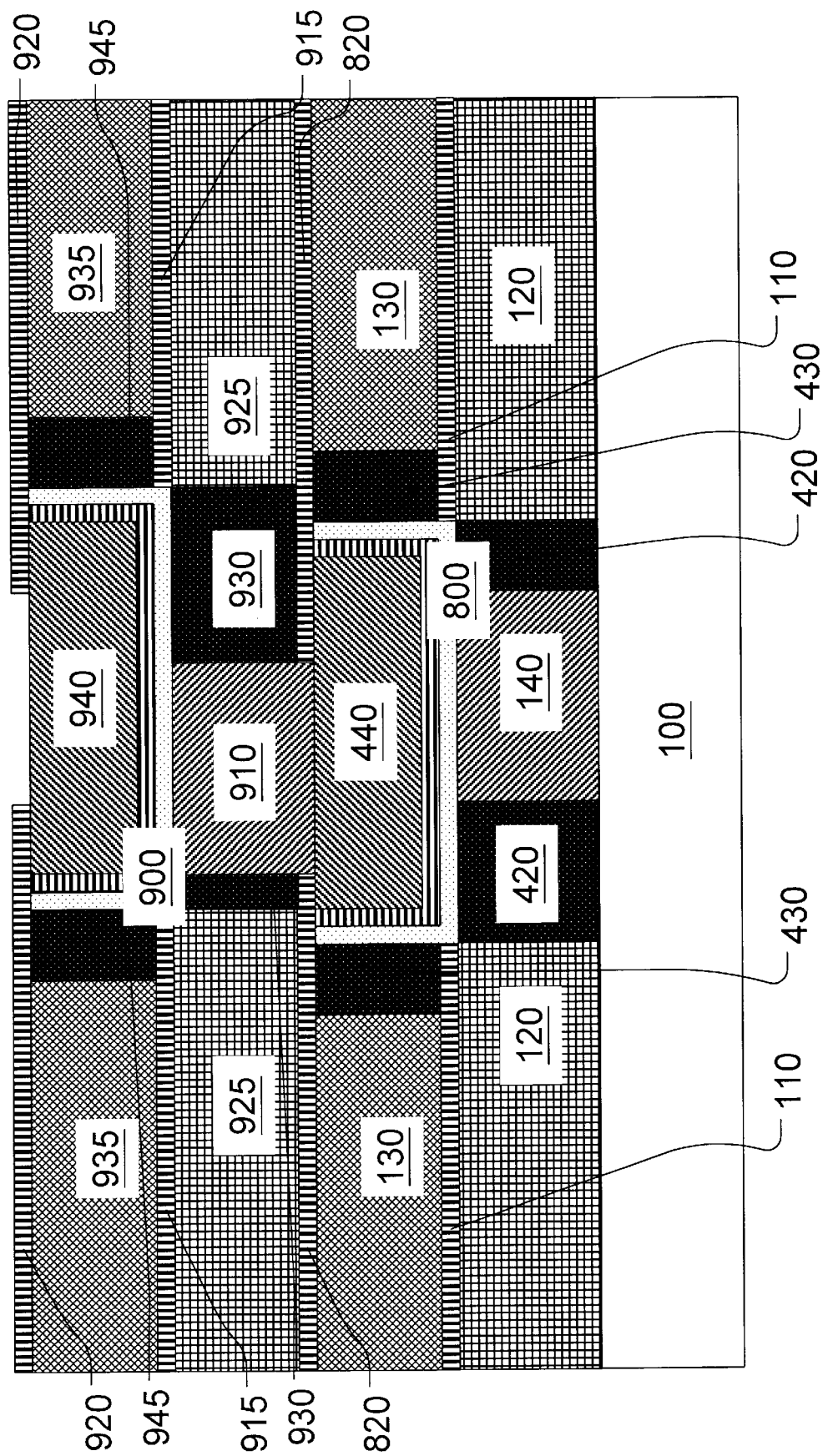
FIG. 9 schematically illustrates multiple layers of copper interconnects according to various embodiments of the present invention.

As shown in FIG. 9, the copper-interconnect layer 800 may be an underlying structure layer (similar to the structure 100) to a copper-interconnect layer 900. The copper-interconnect layer 900 may comprise a copper-filled trench 940 and an intermetal via connection 910 adjacent respective densified regions 945 and 930 of planarized low K dielectric layers 935 and 925, respectively. The intermetal via connection 910 may be a copper (Cu) structure similar to the first copper (Cu) structure 140, and the intermetal via connection 910 may be annealed to the copper-filled trench 940 in a similar fashion to the anneal described above in relation to the formation of the copper-interconnect 745 (FIG. 7). The copper-interconnect layer 900 may also comprise the etch stop layer 820 and/or etch stop layer 915 and/or etch stop layer 920 (also known as "hard masks" and typically formed of silicon nitride, $Si_3N_4$, or SiN, for short) formed and patterned above the planarized low K dielectric layers 925 and/or 935, respectively. The etch stop layer 920 may also be formed above at least a portion of the copper-filled trench 940.

Figure 10:
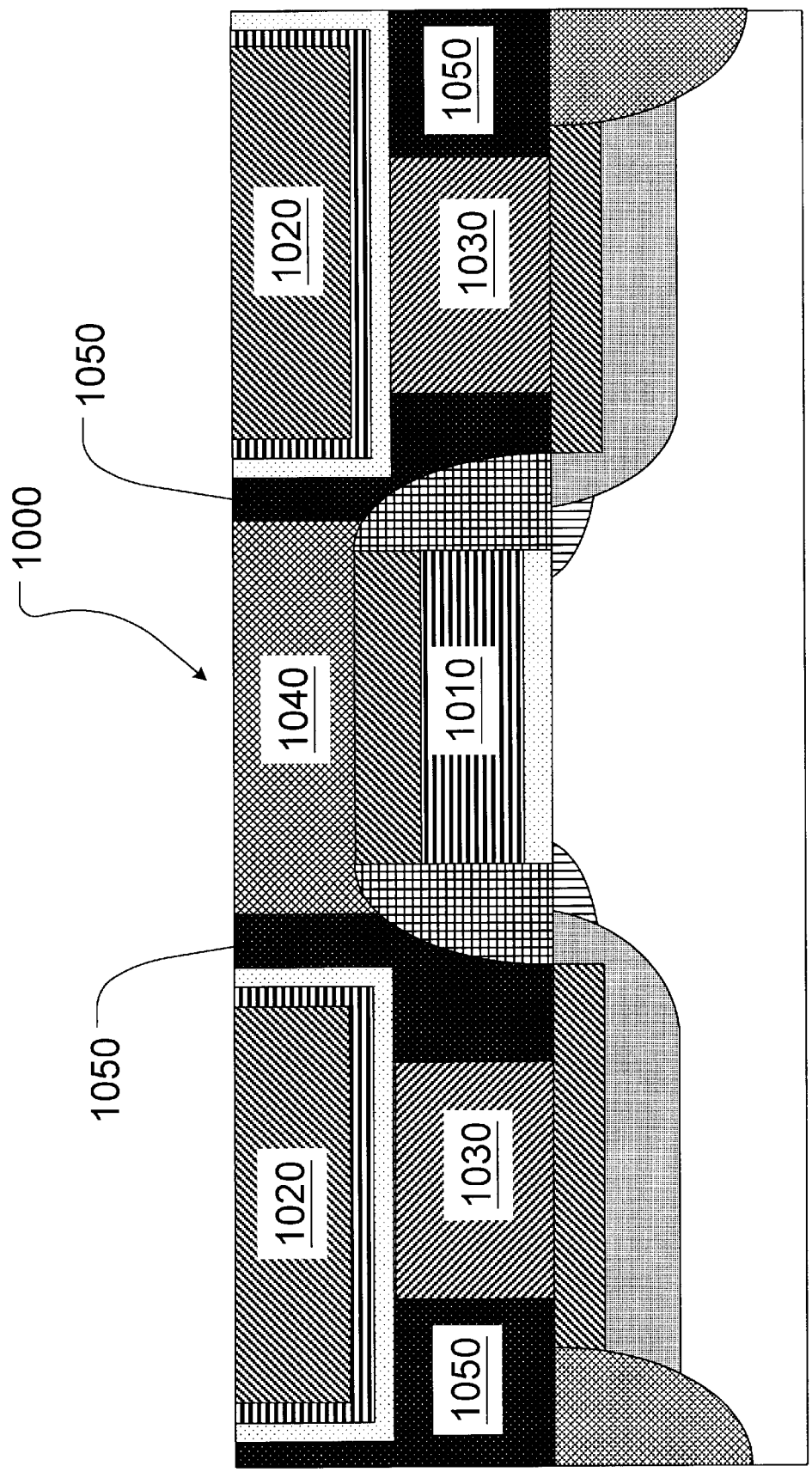
FIG. 10 schematically illustrates copper interconnects according to various embodiments of the present invention connecting source/drain regions of an illustrative semiconductor device.

As shown in FIG. 10, an MOS transistor 1010 may be an underlying structure layer (similar to the structure 100) to a copper-interconnect layer 1000. The copper-interconnect layer 1000 may comprise copper-filled trenches 1020 and copper intermetal via connections 1030 adjacent densified regions 1050 of a planarized low K dielectric layer 1040. The copper intermetal via connections 1030 may be copper (Cu) structures similar to the first copper (Cu) structure 140, and the copper intermetal via connections 1030 may be annealed to the second copper (Cu) structures 1020 in a similar fashion to the anneal described above in relation to the formation of the copper-interconnect 745 (FIG. 7).

Figure 11:
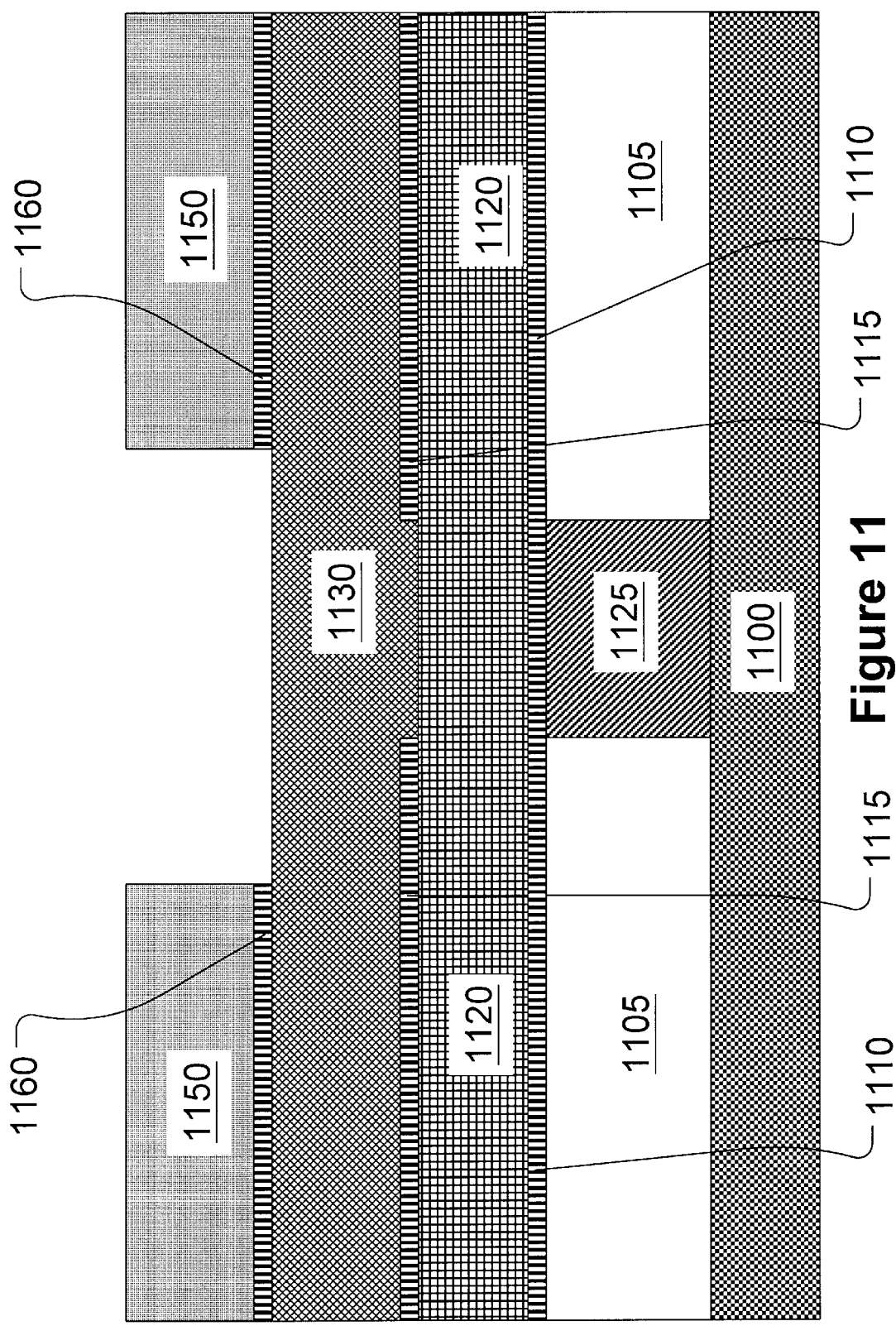
FIGS. 11–18 schematically illustrate a dual-damascene copper interconnect process flow according to various embodiments of the present invention.

As shown in FIG. 11, a first dielectric layer 1105 and a first conductive structure 1125 (such as a copper intermetal via connection) may be formed above a structure 1100 such as a semiconducting substrate. However, the present invention is not limited to the formation of a copper-based interconnect above the surface of a semiconducting substrate such as a silicon wafer, for example. Rather, as will be apparent to one skilled in the art upon a complete reading of the present disclosure, a copper-based interconnect formed in accordance with the present invention may be formed above previously formed semiconductor devices and/or process layer, e.g., transistors, or other similar structure. In effect, the present invention may be used to form process layers on top of previously formed process layers. The structure 1100 may be an underlayer of semiconducting material, such as a silicon substrate or wafer, or, alternatively, may be an underlayer of semiconductor devices (see FIG. 20, for example), such as a layer of metal oxide semiconductor field effect transistors (MOSFETs), and the like, and/or a metal interconnection layer or layers (see FIG. 19, for example) and/or an interlayer dielectric (ILD) layer or layers, and the like.

In a dual-damascene copper process flow, according to various embodiments of the present invention, as shown in FIGS. 11–18, a second dielectric layer 1120 is formed above the first dielectric layer 1105 and above the first conductive structure 1125. A third dielectric layer 1130 is formed above the second dielectric layer 1120. A patterned photomask 1150 is formed above the third dielectric layer 1130. The first dielectric layer 1105 has an etch stop layer (ESL) 1110 (also known as a "hard mask" and typically formed of silicon nitride, $Si_3N_4$, or SiN, for short) formed and patterned thereon, between the first dielectric layer 1105 and the second dielectric layer 1120. Similarly, the second dielectric layer 1120 has an etch stop layer 1115 (also typically formed of SiN) formed and patterned thereon, between the second dielectric layer 1120 and the third dielectric layer 1130.

As will be described in more detail below in conjunction with FIG. 12, the first etch stop layer 1110 and a second etch stop layer 1115 define a lower (via) portion of the copper interconnect formed in the dual-damascene copper process flow. If necessary, the third dielectric layer 1130 may be planarized using chemical-mechanical planarization (CMP). The third dielectric layer 1130 has a hard mask layer 1160 (typically also SiN) formed and patterned thereon, between the third dielectric layer 1130 and the patterned photomask 1150.

The first, second and third dielectric layers 1105, 1120 and 1130 may be formed from a variety of "low dielectric constant" or "low K" (K is less than or equal to about 4) dielectric materials. The low K first, second and third dielectric layers 1105, 1120 and 1130 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and may each have a thickness ranging from approximately 1000 Å-5000 Å, for example.

The low K first, second and third dielectric layers 1105, 1120 and 1130 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the low K first, second and third dielectric layers 1105, 1120 and 1130 are each comprised of Applied Material's Black Diamond®, each having a thickness of approximately 5000 Å, each being formed by being blanket-deposited by a PECVD.

Figure 12:
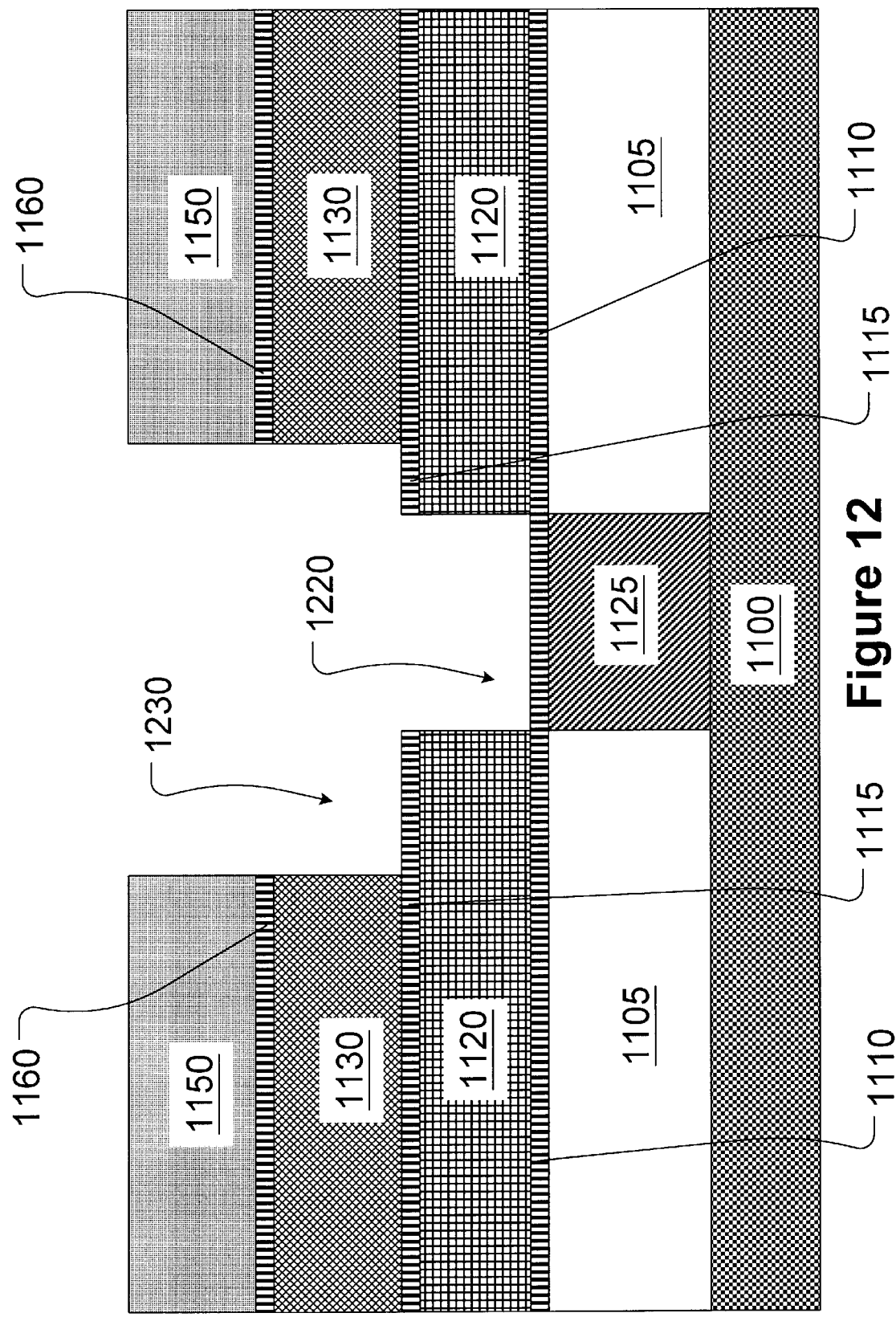

As shown in FIG. 12, a metallization pattern is then formed by using the patterned photomask 1150, the etch stop layer 1110, the hard mask layers 1115 and 1160 (FIGS. 11–12), and photolithography. For example, first and second openings, such as via 1220 and trench 1230, for conductive metal lines, contact holes, via holes, and the like, are etched into the second and third dielectric layers 1120 and 1130, respectively (FIG. 12). The first and second openings 1220 and 1230 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments. The etching may stop at the etch stop layer 1110.

Figure 13:
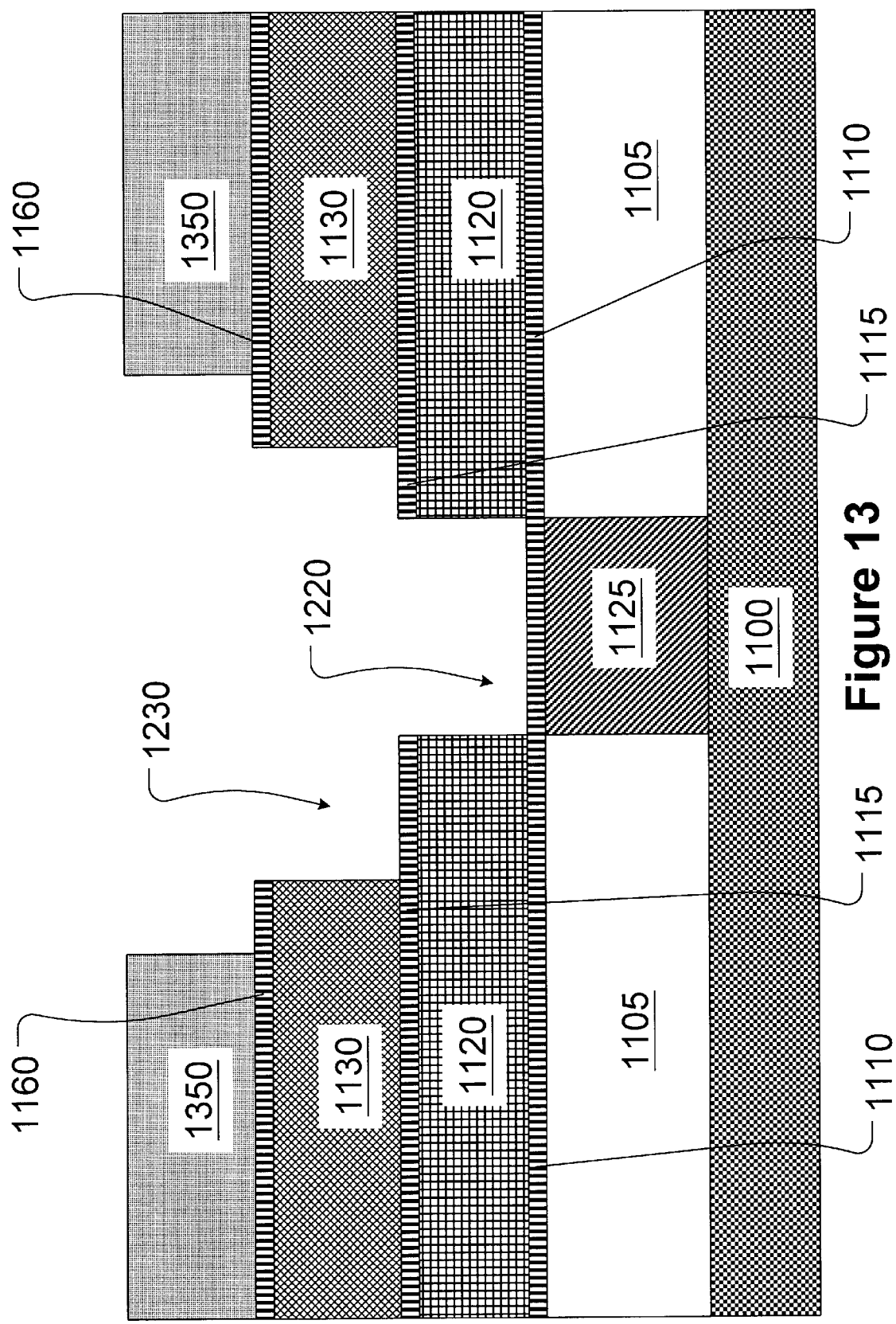

As shown in FIG. 13, the patterned photomask 1150 is trimmed, using a controlled photoresist trim, for example, forming a trimmed photomask 1350. The patterned photomask 1150 may be trimmed by ashing, using a molecular oxygen ($O_2$) ashing, for example. Approximately 100–500 Å of the patterned photomask 1150 may be trimmed by the ashing.

Figure 14:
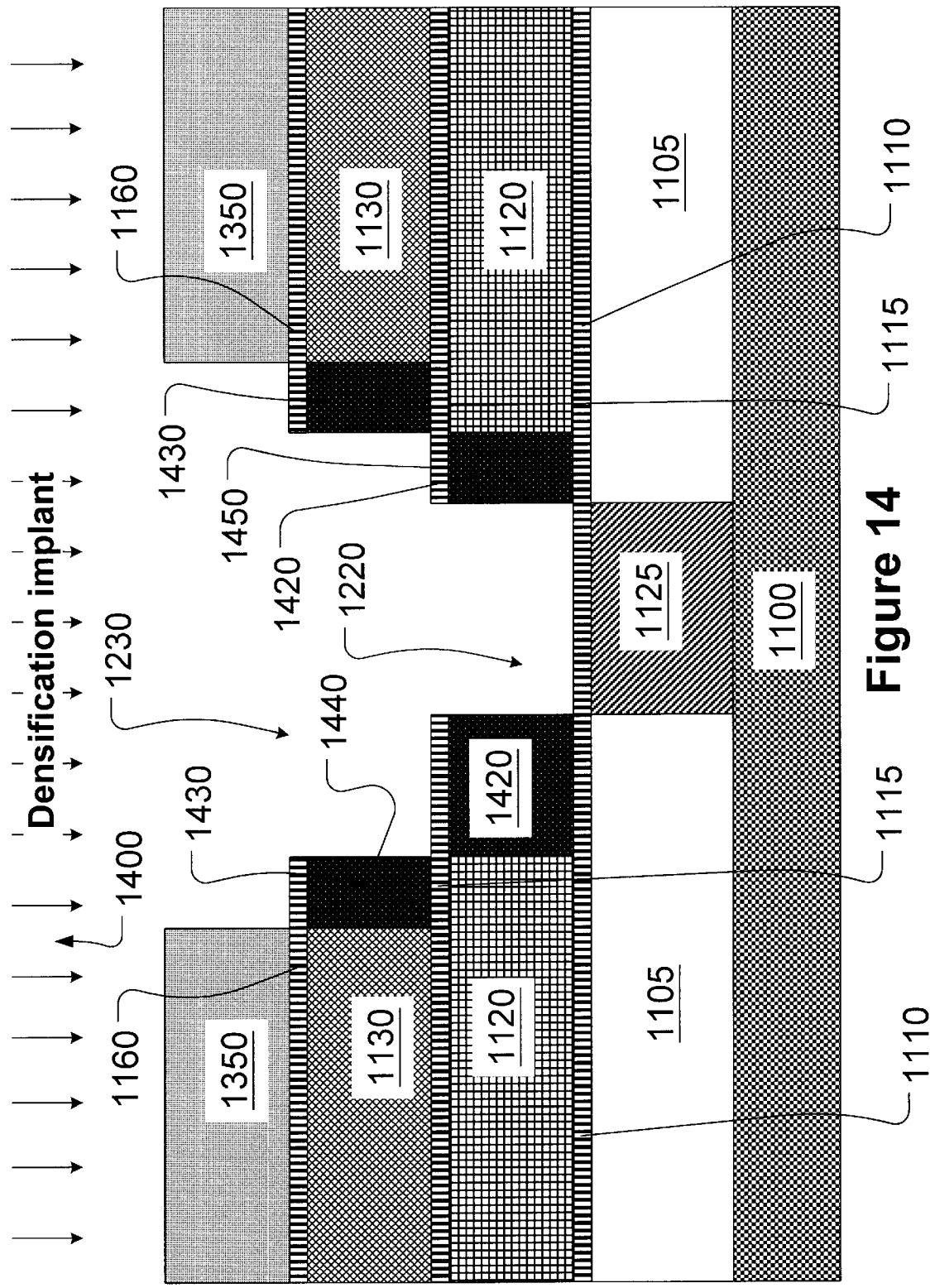

As shown in FIG. 14, a densification implant 1400 (indicated by the arrows) may be implanted into the low K second and third dielectric layers 1120 and 1130 to form respective densified regions 1420 and 1430 in the low K second and third dielectric layers 1120 and 1130 adjacent the openings 1220 and 1230, respectively. The densified regions 1420 in the low K second dielectric layer 1120 would, of course, be symmetrical if the opening 1220 were centered in the opening 1230. The densification implant 1400 increases the density of sidewalls 1440 and bottom areas 1450 of the openings 1220 and 1230 by about 5–50%, and, hence, reinforces the sidewalls 1440 and the bottom areas 1450 of the openings 1220 and 1230. In various illustrative embodiments, the densified regions 1420 and 1430 may be formed by being implanted with a densification dose of silicon (Si), silicon dioxide ($SiO_2$), germanium (Ge), and the like. The densification dose of the densification implant 1400 may range from about $5.0 \times 10^{13} - 2.0 \times 10^{15}$ ions/$cm^2$ at an implant energy ranging from about 5–50 keV. The densified regions 1420 and 1430 may be subjected to a rapid thermal anneal (RTA) process performed at a temperature ranging from approximately 400–1000° C. for a time ranging from approximately 5–60 seconds. The RTA process may activate the densification implant 1400 and reinforce the densification process.

Figure 15:
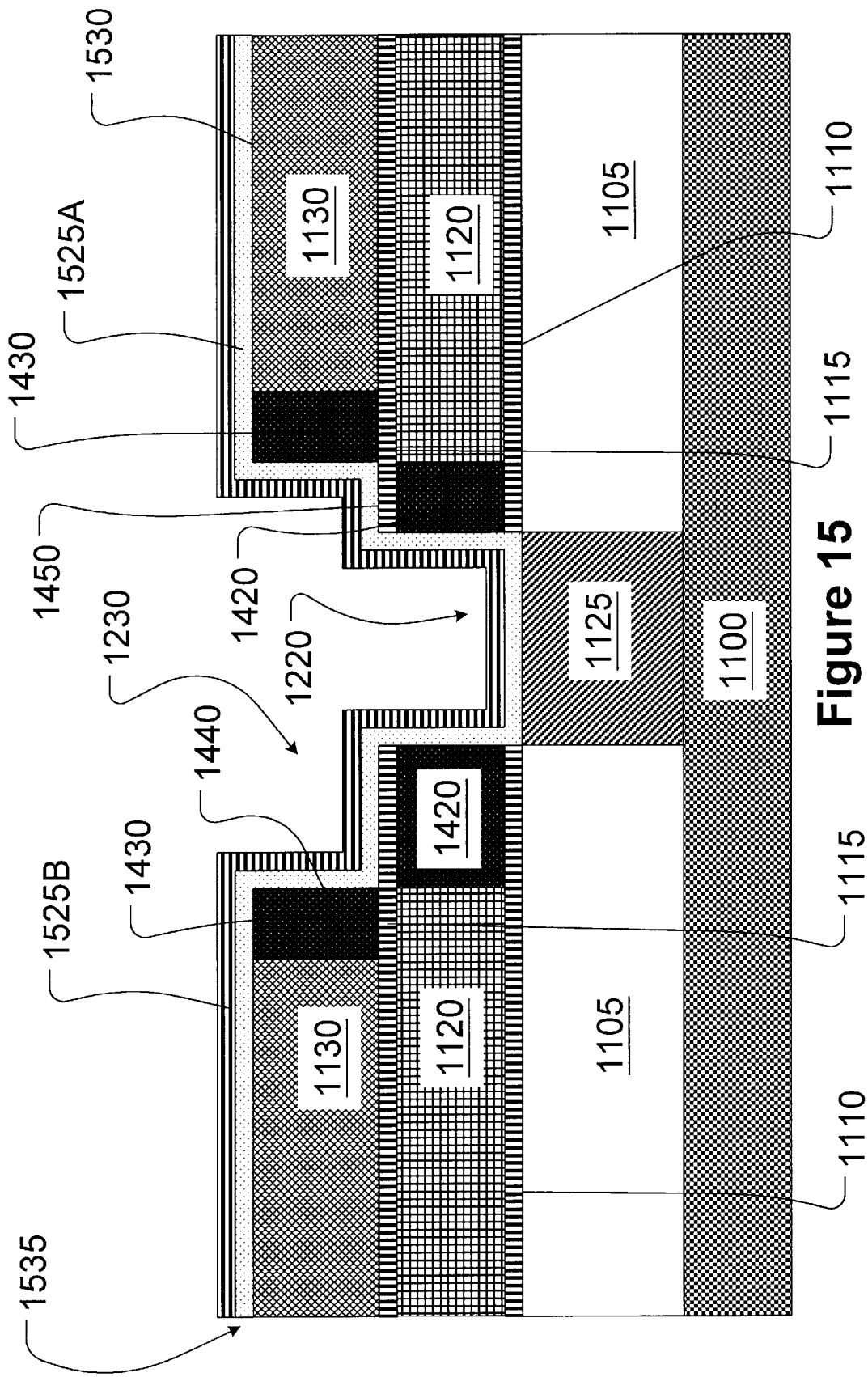

As shown in FIG. 15, the trimmed photomask 1350 and the hard mask layer 1160 are then stripped, the etch stop layer 1110 is removed above the first conductive structure 1125, and a thin barrier metal layer 1525A and a copper seed layer 1525B are applied to the entire surface using vapor-phase deposition (FIG. 15). The barrier metal layer 1525A and the copper (Cu) seed layer 1525B blanket-deposit the entire upper surface 1530 of the third dielectric layer 1130 as well as the sidewalls 1440 and bottom areas 1450 of the first and second openings 1220 and 1230, and the first conductive structure 1125, thereby forming a conductive surface 1535, as shown in FIG. 15.

The barrier metal layer 1525A may be formed of at least one layer of a barrier metal material, such as tantalum or tantalum nitride, and the like. For example, the barrier metal layer 1525A may also be formed of titanium nitride, titanium-tungsten, nitrided titanium-tungsten, or another suitable barrier material. The copper seed layer 1525B may be formed on top of the one or more barrier metal layers 1525A by physical vapor deposition (PVD) or chemical vapor deposition (CVD), for example.

The bulk of the copper trench-fill is frequently done using an electroplating technique, where the conductive surface 1535 is mechanically clamped to an electrode (not shown) to establish an electrical contact, and the structure 1100 is then immersed in an electrolyte solution containing copper (Cu) ions. An electrical current is then passed through the wafer-electrolyte system to cause reduction and deposition of copper (Cu) on the conductive surface 1535. In addition, an alternating-current bias of the wafer-electrolyte system has been considered as a method of self-planarizing the deposited copper (Cu) film, similar to the deposit-etch cycling used in high-density plasma (HDP) tetraethyl orthosilicate (TEOS) dielectric depositions.

Figure 16:
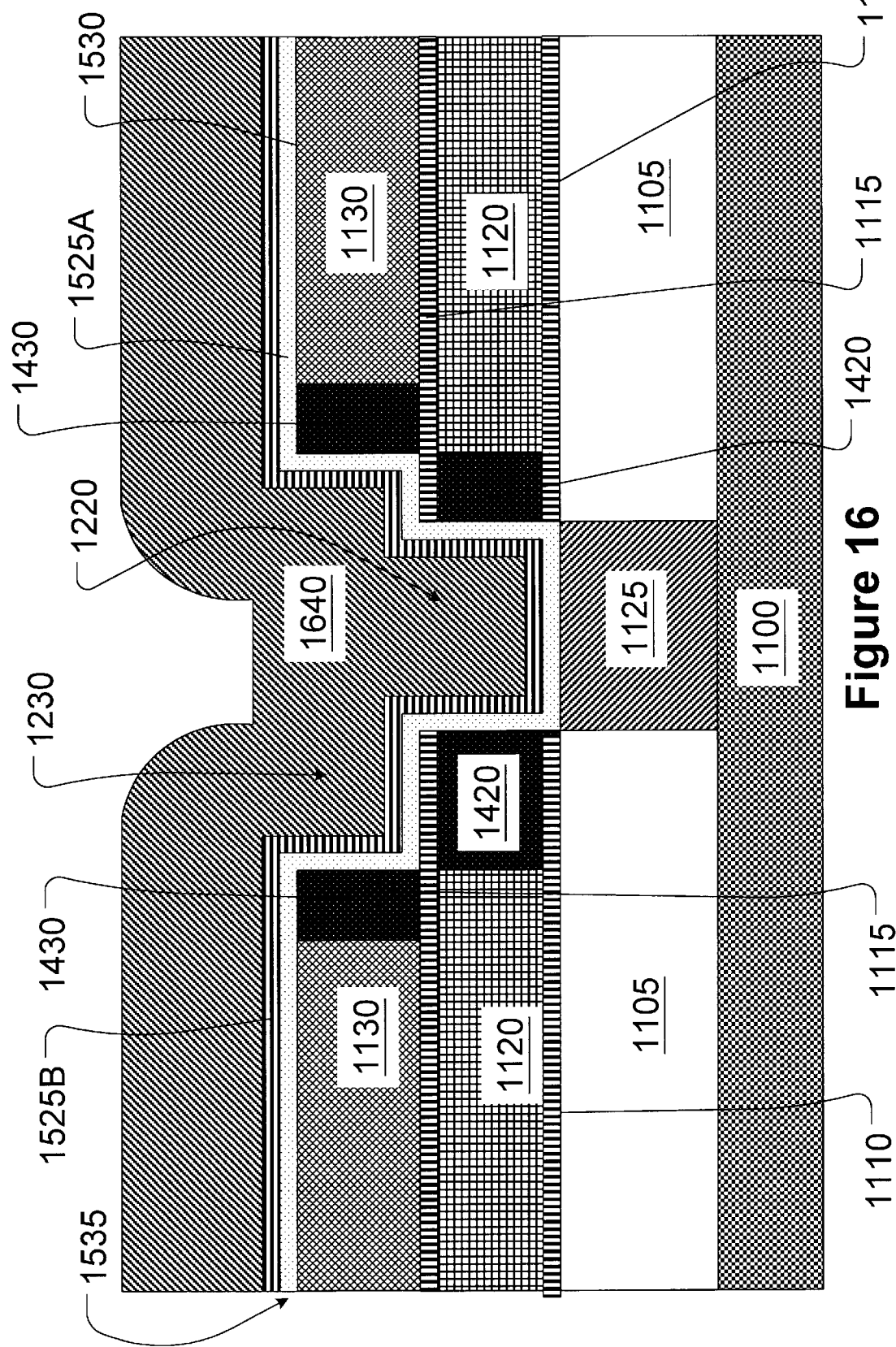
Figure 17:
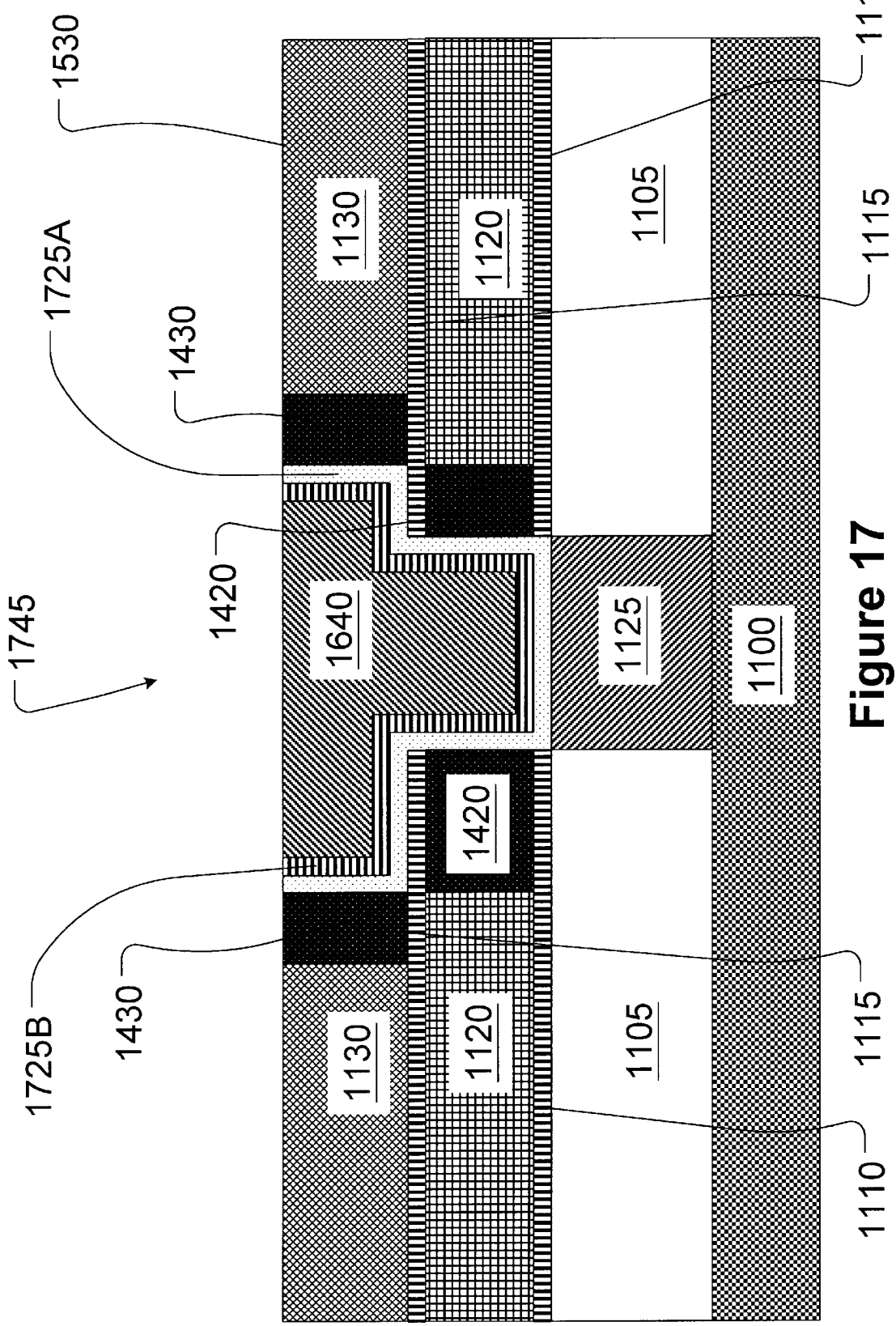

As shown in FIG. 16, this process typically produces a conformal coating of copper (Cu) 1640 of substantially constant thickness across the entire conductive surface 1535. As shown in FIG. 17, once a sufficiently thick layer of copper (Cu) 1640 has been deposited, the layer of copper (Cu) 1640 is planarized using chemical mechanical polishing (CMP) techniques. The planarization using CMP clears all copper (Cu) and barrier metal from the entire upper surface 1530 of the third dielectric layer 1130, leaving the copper (Cu) 1640 only in a metal structure such as a copper-filled trench and via, forming a copper-interconnect 1745, adjacent remaining portions 1725A and 1725B of the one or more barrier metal layers 1525A and copper seed layer 1525B (FIGS. 15 and 16), respectively, as shown in FIG. 17.

As shown in FIG. 17, the copper-interconnect 1745 may be formed by annealing the copper (Cu) 1640, adjacent the remaining portions 1725A and 1725B of the one or more barrier metal layers 1525A and copper seed layer 1525B (FIGS. 15 and 16), to the first conductive structure 1125. The anneal process may be performed in a traditional tube furnace, at a temperature ranging from approximately 100–500° C., for a time period ranging from approximately 10–180 minutes, in a nitrogen-containing ambient that may comprise at least one of $N_2$, $H_2$, Ar, $NH_3$, and the like. Alternatively, the anneal process may be a rapid thermal anneal (RTA) process performed at a temperature ranging from approximately 100–500° C. for a time ranging from approximately 10–180 seconds in a nitrogen-containing ambient that may comprise at least one of $N_2$, $H_2$, Ar, and the like.

Figure 18:
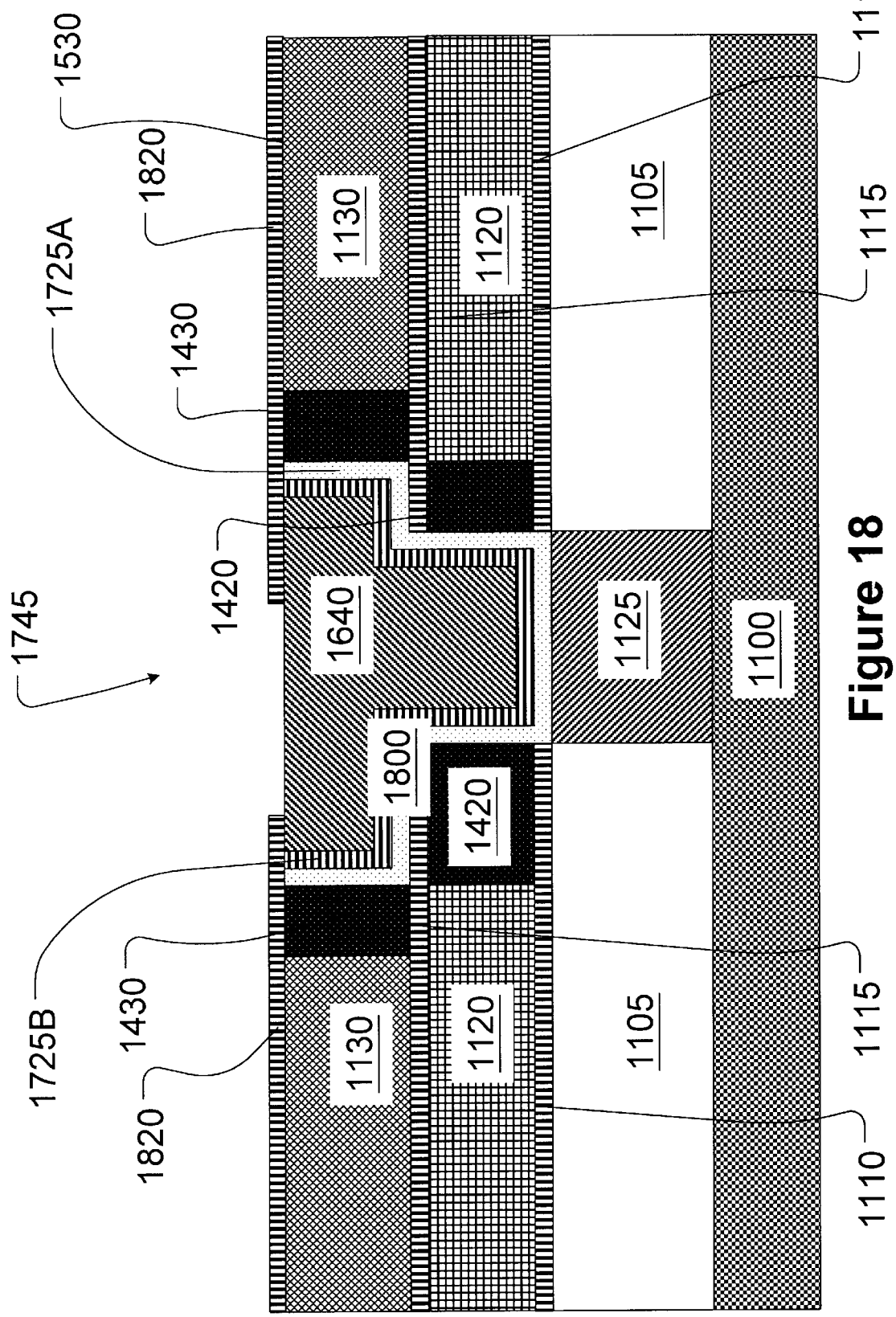

As shown in FIG. 18, the low K third dielectric layer 1130 may be planarized, as needed, using chemical mechanical polishing (CMP) techniques. Planarization would leave the planarized low K third dielectric layer 1130 adjacent the copper-interconnect 1745 and above the etch stop layer 1115, forming a portion of a copper-interconnect layer 1800. The copper-interconnect layer 1800 may comprise the copper-interconnect 1745 adjacent the respective densified regions 1420 and 1430 of the second and third dielectric layers 1120 and 1130, respectively. The copper-interconnect layer 1800 may also comprise the first etch stop layer 1110. As shown in FIG. 18, the copper-interconnect layer 1800 may also comprise an etch stop layer 1820 (also known as a "hard mask" and typically formed of silicon nitride, $Si_3N_4$, or SiN, for short) formed and patterned above the third dielectric layer 1130 and above at least a portion of the copper-interconnect 1745.

Figure 19:
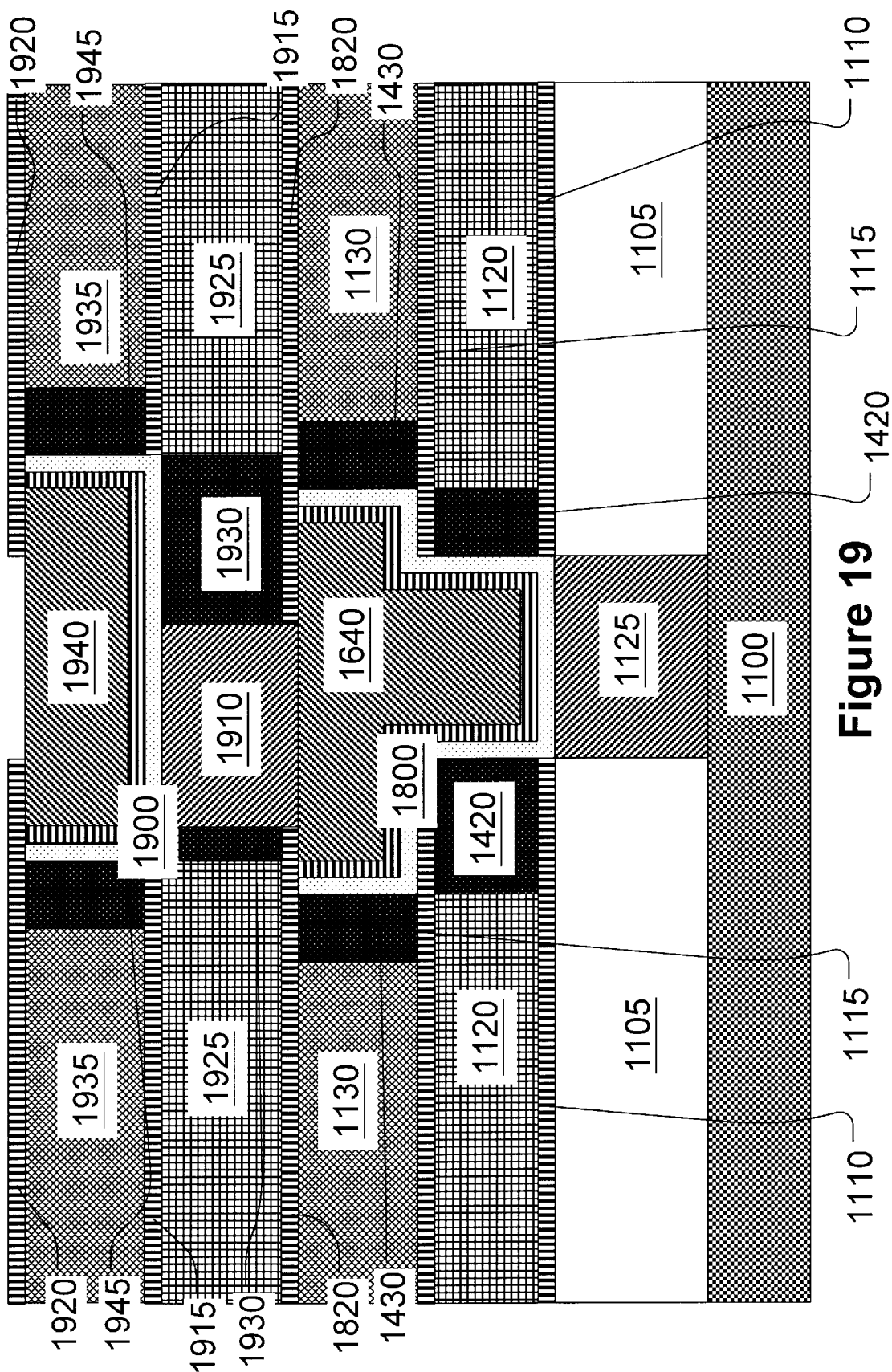
FIG. 19 schematically illustrates multiple layers of copper interconnects according to various embodiments of the present invention.

As shown in FIG. 19, the copper-interconnect layer 1800 may be an underlying structure layer (similar to the structure 1100) to a copper-interconnect layer 1900. In various illustrative embodiments, the copper-interconnect layer 1900 may comprise a copper-filled trench 1940 adjacent densified regions 1945 of a planarized low K dielectric layer 1935, an intermetal via connection 1910 adjacent densified regions 930 of a planarized low K dielectric layer 1925, and an etch stop layer 1915 between the low K dielectric layers 1935 and 1925. The intermetal via connection 1910 may be a copper (Cu) structure similar to the first copper (Cu) structure 1125, and the intermetal via connection 1910 may be annealed to the copper-filled trench 1940 in a similar fashion to the anneal described above in relation to the formation of the copper-interconnect 745 (FIG. 7). The copper-interconnect layer 1900 may also comprise the etch stop layer 1820 and/or an etch stop layer 1920 formed and patterned above the planarized low K dielectric layer 1935 and above at least a portion of the copper-filled trench 1940.

In various alternative illustrative embodiments, the copper-interconnect layer 1900 may be similar to the copper-interconnect layer 1800, the copper-interconnect layer 1900 having a copper-interconnect disposed therein (not shown) that is similar to the copper-interconnect 1745 (FIGS. 17–18), for example. The copper-interconnect disposed in the copper-interconnect layer 1900 may be annealed to the copper-interconnect 1745 disposed in the copper-interconnect layer 1800 in a similar fashion to the anneal described above in relation to the formation of the copper-interconnect 1745 (FIG. 17).

Figure 20:
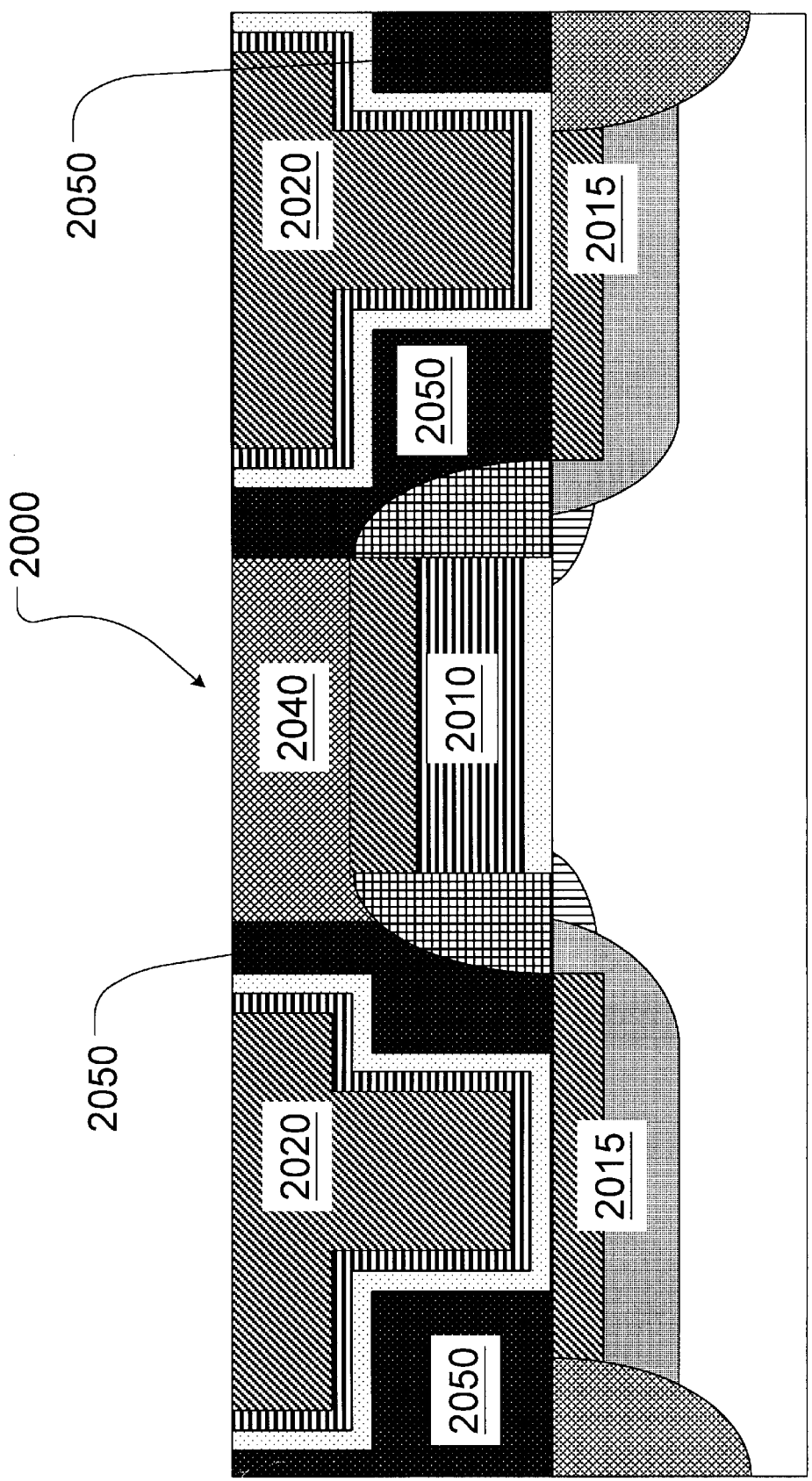
FIG. 20 schematically illustrates copper interconnects according to various embodiments of the present invention connecting source/drain regions of an illustrative semiconductor device.

As shown in FIG. 20, an MOS transistor 2010 may be an underlying structure layer (similar to the structure 1100) to a copper-interconnect layer 2000. The copper-interconnect layer 2000 may comprise copper-filled trenches and vias 2020 adjacent densified regions 2050 a planarized low K dielectric layer 2040. The copper-filled trenches and vias 2020 may be annealed to an underlying conductive structure such as source/drain regions 2015 of the MOS transistor 2010 in a similar fashion to the anneal described above in relation to the formation of the copper-interconnect 1745 (FIG. 17).

The dual-damascene copper process flow according to various embodiments of the present invention, as shown in FIGS. 11–18, combines the intermetal via connection formation with the copper (Cu) trench-fill formation by etching a more complex pattern before the formation of the barrier metal layer and copper (Cu) seed layer and before the copper (Cu) trench-fill. The trench etching continues until the via hole (such as the first opening 1220 in FIG. 12) has been etched out. The rest of the dual-damascene copper process flow according to various embodiments of the present invention, as shown in FIGS. 13–18, is essentially identical with the corresponding single-damascene copper process flow according to various embodiments of the present invention, as shown in FIGS. 3–8. Overall, however, the dual-damascene copper process flow according to various embodiments of the present invention significantly reduces the number of processing steps and is a preferred method of achieving copper-metallization.

Any of the above-disclosed embodiments of a method of forming a copper interconnect enables a copper interconnect to be formed using conventional damascene techniques in conjunction with densified low K dielectric materials that are far more robust than the conventional low K materials typically used in conventional damascene techniques. The densified low K dielectric materials are far less susceptible to damage during the etching and subsequent processing steps of the conventional damascene techniques than are the conventional low K materials. By forming a densified low K dielectric layer adjacent the copper interconnect, all of the advantages of using a low K dielectric layer to reduce the capacitance and RC delays between adjacent copper interconnects are retained, without any of the difficulties of forming the copper interconnect using a conventional undensified low K dielectric during the conventional damascene processing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:
    forming a first conductive structure;
    forming a first dielectric layer above the first conductive structure;
    forming a first opening in the first dielectric layer above at least a portion of the first conductive structure, the first opening having sidewalls; and
    densifying the sidewalls by performing a densification ion implant process by implanting at least one of silicon, silicon dioxide and germanium into the sidewalls.

2. The method of claim 1, further comprising:
    forming a metal structure in the first opening, the metal structure contacting the at least the portion of the first conductive structure; and
    forming an interconnect by annealing the metal structure and the first conductive structure.

3. The method of claim 2, further comprising:
    forming a second dielectric layer below the first dielectric layer;
    forming a second opening in the second dielectric layer;
    forming the first conductive structure in the first opening; and
    planarizing the first dielectric layer, wherein forming the first dielectric layer comprises forming the first dielectric layer using a low dielectric constant (low K) dielectric material, having a dielectric constant K of at most about four.

4. The method of claim 3, further comprising:
    forming and patterning a mask layer above the first dielectric layer to have a mask layer opening above at least a portion of the metal structure.

5. The method of claim 3, wherein forming the second dielectric layer comprises forming the second dielectric layer using a low dielectric constant (low K) dielectric material, having a dielectric constant K of at most about four, and forming the second dielectric layer using one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

6. The method of claim 1, wherein forming the first opening in the first dielectric layer comprises forming the first opening in the first dielectric layer using one of a mask of photoresist and a hard mask layer, the one of the mask of photoresist and the hard mask layer being formed and patterned above the first dielectric layer.

7. The method of claim 6, wherein using the one of the mask of photoresist and the hard mask layer comprises using the hard mask layer being formed of silicon nitride.

8. The method of claim 1, wherein forming the metal structure comprises forming the metal structure using electrochemical deposition of copper.

9. The method of claim 8, wherein using the electrochemical deposition of the copper comprises forming at least one barrier layer and a copper seed layer in the second opening before the electrochemical deposition of the copper, and planarizing the copper using chemical mechanical polishing after the electrochemical deposition of the copper.

10. A method comprising:
    forming a first dielectric layer above a structure layer;
    forming a first opening in the first dielectric layer;
    forming a first copper layer above the first dielectric layer and in the first opening;
    forming a copper structure by removing portions of the copper layer above the first dielectric layer, leaving the copper structure in the first opening;
    forming a second dielectric layer above the first dielectric layer and above the copper structure;
    forming a second opening in the second dielectric layer above at least a portion of the copper structure, the second opening having sidewalls; and
    densifying the sidewalls of the second opening by performing a densification ion implant process by implanting at least one of silicon, silicon dioxide and germanium into the sidewalls of the second opening.

11. The method of claim 10, further comprising:
    forming a second copper layer above the second dielectric layer and in the second opening, the second copper layer being disposed above the at least the portion of the copper structure;
    forming the copper interconnect by removing portions of the second copper layer above the second dielectric layer, leaving the copper interconnect in the second opening; and
    annealing the copper interconnect.

12. The method of claim 11, further comprising:
    planarizing the second dielectric layer, wherein forming the second dielectric layer comprises forming the second dielectric layer using a low dielectric constant (low K) dielectric material, having a dielectric constant K of at most about four.

13. The method of claim 12, further comprising:
forming and patterning a mask layer above the second dielectric layer to have a mask layer opening above at least a portion of the copper interconnect.

14. The method of claim 10, wherein forming the first dielectric layer comprises forming the first dielectric layer using a low dielectric constant (low K) dielectric material, having a dielectric constant K of at most about four, and forming the first dielectric layer using one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

15. The method of claim 14, wherein forming the second opening in the second dielectric layer comprises forming the second opening in the second dielectric layer using one of a mask of photoresist and a hard mask layer, the one of the mask of photoresist and the hard mask layer being formed and patterned above the second dielectric layer.

16. The method of claim 15, wherein using the one of the mask of photoresist and the hard mask layer comprises using the hard mask layer being formed of silicon nitride.

17. The method of claim 10, wherein forming the second copper layer comprises forming the second copper layer using electrochemical deposition of copper.

18. The method of claim 17, wherein using the electrochemical deposition of the copper comprises forming at least one barrier layer and a copper seed layer in the second opening before the electrochemical deposition of the copper, and removing portions of the second copper layer comprises planarizing the copper using chemical mechanical polishing after the electrochemical deposition of the copper.

19. A method of forming a copper interconnect, the method comprising:
forming a first dielectric layer above a structure layer;
forming a first opening in the first dielectric layer;
forming a copper via in the first opening;
forming a second dielectric layer above the first dielectric layer and above the copper via;
forming a second opening in the second dielectric layer above at least a portion of the copper via, the second opening having sidewalls; and
densifying the sidewalls of the second opening by performing a densification ion implant process by implanting at least one of silicon, silicon dioxide and germanium into the sidewalls of the second opening.

20. The method of claim 19, further comprising:
forming a copper line in the second opening, the copper line being disposed above the at least the portion of the copper via; and
forming the copper interconnect by annealing the copper line and the copper via.

21. The method of claim 20, further comprising:
planarizing the second dielectric layer, wherein forming the second dielectric layer comprises forming the second dielectric layer using a low dielectric constant (low K) dielectric material, having a dielectric constant K of at most about four.

22. The method of claim 21, further comprising:
forming and patterning a mask layer above the second dielectric layer to have a mask layer opening above at least a portion of the second copper structure.

23. The method of claim 19, wherein forming the first dielectric layer comprises forming the first dielectric layer using a low dielectric constant (low K) dielectric material, having a dielectric constant K of at most about four, and forming the first dielectric layer using one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

24. The method of claim 19, wherein forming the second opening in the second dielectric layer comprises forming the second opening in the second dielectric layer using one of a mask of photoresist and a hard mask layer, the one of the mask of photoresist and the hard mask layer being formed and patterned above the second dielectric layer.

25. The method of claim 24, wherein using the one of the mask of photoresist and the hard mask layer comprises using the hard mask layer being formed of silicon nitride.

26. The method of claim 19, wherein forming the second copper layer comprises forming the second copper layer using electrochemical deposition of copper.

27. The method of claim 26, wherein using the electrochemical deposition of the copper comprises forming at least one barrier layer and a copper seed layer in the second opening before the electrochemical deposition of the copper, and planarizing the copper using chemical mechanical polishing after the electrochemical deposition of the copper.

28. A method of forming a copper interconnect, the method comprising:
forming a first dielectric layer above a structure layer;
forming a first opening in the first dielectric layer;
forming a first copper layer above the first dielectric layer and in the first opening;
forming a copper via by removing portions of the first copper layer above the first dielectric layer, leaving the copper via in the first opening;
forming a second dielectric layer above the first dielectric layer and above the copper via;
forming a second opening in the second dielectric layer above at least a portion of the copper via, the second opening having sidewalls; and
densifying the sidewalls of the second opening by performing a densification ion implant process by implanting at least one of silicon, silicon dioxide and germanium into the sidewalls of the second opening.

29. The method of claim 28, further comprising:
forming a second copper layer above the second dielectric layer and in the second opening, the second copper layer being disposed above the at least the portion of the copper via;
forming the copper interconnect by removing portions of the second copper layer above the second dielectric layer, leaving the copper interconnect in the second opening; and
annealing the copper interconnect.

30. The method of claim 29, further comprising:
planarizing the second dielectric layer, wherein forming the second dielectric layer comprises forming the second dielectric layer using a low dielectric constant (low K) dielectric material, having a dielectric constant K of at most about four.

31. The method of claim 30, further comprising:
forming and patterning a mask layer above the second dielectric layer to have a mask layer opening above at least a portion of the copper interconnect.

32. The method of claim 28, wherein forming the first dielectric layer comprises forming the first dielectric layer using a low dielectric constant (low K) dielectric material, having a dielectric constant K of at most about four, and forming the first dielectric layer using one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

33. The method of claim 28, wherein forming the second opening in the second dielectric layer comprises forming the second opening in the second dielectric layer using one of a mask of photoresist and a hard mask layer, the one of the mask of photoresist and the hard mask layer being formed and patterned above the second dielectric layer.

34. The method of claim 33, wherein using the one of the mask of photoresist and the hard mask layer comprises using the hard mask layer being formed of silicon nitride.

35. The method of claim 28, wherein forming the second copper layer comprises forming the second copper layer using electrochemical deposition of copper.

36. The method of claim 35, wherein using the electrochemical deposition of the copper comprises forming at least one barrier layer and a copper seed layer in the second opening before the electrochemical deposition of the copper, and removing portions of the second copper layer comprises planarizing the copper using chemical mechanical polishing after the electrochemical deposition of the copper.

37. A method comprising:

forming a first dielectric structure using a low dielectric constant (low K) dielectric material, having a dielectric constant K of at most about four;

forming a first opening in the first dielectric layer;

forming a first conductive structure in the first opening;

planarizing the first dielectric layer;

forming a second dielectric layer above the first dielectric layer, using a low dielectric constant (low K) dielectric material, having a dielectric constant K of at most about four;

forming a second opening in the second dielectric layer above at least a portion of the first conductive structure, the first opening having sidewalls; and densifying the sidewalls and a portion of the first dielectric layer adjacent the first conductive structure by implanting at least one of silicon, silicon dioxide and germanium into the sidewalls.

38. The method of claim 37, further comprising:

forming a metal structure in the second opening, the metal structure contacting the at least the portion of the first conductive structure; and forming an interconnect by annealing the metal structure and the first conductive structure.

39. The method of claim 38, further comprising:

forming and patterning a mask layer above the second dielectric layer to have a mask layer opening above at least a portion of the metal structure.

40. The method of claim 39, wherein forming the second dielectric layer comprises forming the second dielectric layer using one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

41. The method of claim 37, wherein implanting at least one of silicon, silicon dioxide and germanium into the sidewalls comprises implanting at least one of silicon, silicon dioxide and germanium into the sidewalls at an implant energy ranging from approximately 5–50 KeV.

42. The method of claim 37, wherein forming the second opening in the second dielectric layer comprises forming the second opening in the second dielectric layer using one of a mask of photoresist and a hard mask layer, the one of the mask of photoresist and the hard mask layer being formed and patterned above the second dielectric layer.

43. The method of claim 42, wherein using the one of the mask of photoresist and the hard mask layer comprises using the hard mask layer being formed of silicon nitride.

44. The method of claim 37, wherein forming the metal structure comprises forming the metal structure using electrochemical deposition of copper.

45. The method of claim 44, wherein using the electrochemical deposition of the copper comprises forming at least one barrier layer and a copper seed layer in the second opening before the electrochemical deposition of the copper, and planarizing the copper using chemical mechanical polishing after the electrochemical deposition of the copper.

* * * * *